(12) United States Patent
Jeong et al.

(10) Patent No.: US 12,004,412 B2
(45) Date of Patent: Jun. 4, 2024

(54) INKJET PRINTING APPARATUS, DIPOLE ALIGNMENT METHOD, AND DISPLAY DEVICE MANUFACTURING METHOD

(71) Applicant: Samsung Display Co., LTD., Yongin-si (KR)

(72) Inventors: Heung Cheol Jeong, Hwaseong-si (KR); Byung Chul Lee, Hwaseong-si (KR); Myung Soo Huh, Suwon-si (KR); Jin Oh Kwag, Yongin-si (KR); Do Hun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 617 days.

(21) Appl. No.: 17/278,126

(22) PCT Filed: Apr. 8, 2019

(86) PCT No.: PCT/KR2019/004128
§ 371 (c)(1),
(2) Date: Mar. 19, 2021

(87) PCT Pub. No.: WO2020/059994
PCT Pub. Date: Mar. 26, 2020

(65) Prior Publication Data
US 2021/0336142 A1    Oct. 28, 2021

(30) Foreign Application Priority Data
Sep. 21, 2018 (KR) .......................... 10-2018-0114340

(51) Int. Cl.
*H10K 71/13* (2023.01)
(52) U.S. Cl.
CPC .................................. *H10K 71/135* (2023.02)
(58) Field of Classification Search
CPC ..... B41J 2/045; B41J 2/06; B41J 2/095; B41J 2/135; B41J 2/45; H10K 71/135
See application file for complete search history.

(56) References Cited

U.S. PATENT DOCUMENTS 8,888,255 B2   11/2014   Mardilovich et al.
9,631,107 B2    4/2017   Secord et al.
(Continued)

FOREIGN PATENT DOCUMENTS

CN   1684834   10/2005
CN   1994739    7/2007
(Continued)

OTHER PUBLICATIONS

International Search Report, with English translation, corresponding to International Application No. PCT/KR2019/004128 dated Jul. 15, 2019.
(Continued)

*Primary Examiner* — Anh T Vo
(74) *Attorney, Agent, or Firm* — KILE PARK REED & HOUTTEMAN PLLC

(57) ABSTRACT

An inkjet printing apparatus, a dipole alignment method, and a display device manufacturing method are provided. The inkjet printing apparatus includes a stage, a print head part disposed above the stage, and an electric field generating part that provides an electric field to a space between the stage and the print head part. The dipole alignment method includes providing an electric field at an area above a target substrate, spraying ink including a dipole onto the target substrate through the area, and landing the dipole on the target substrate. The display device manufacturing method includes preparing a base layer on which first and second electrodes are disposed, spraying ink including a light emitting element onto the base layer through the area, landing the light emitting element between the first and second electrodes.

23 Claims, 24 Drawing Sheets

(56) References Cited

U.S. PATENT DOCUMENTS

| | | | |
|---|---|---|---|
| 9,631,108 B2 | 4/2017 | Secord et al. | |
| 9,783,695 B2 | 10/2017 | Barbet et al. | |
| 10,266,715 B2 | 4/2019 | Barbet et al. | |
| 2003/0108804 A1 | 6/2003 | Cheng et al. | |
| 2006/0017782 A1 | 1/2006 | Nishi et al. | |
| 2007/0052757 A1 | 3/2007 | Jacobson | |
| 2007/0153056 A1 | 7/2007 | Lee | |
| 2008/0062217 A1 | 3/2008 | Kang et al. | |
| 2008/0284768 A1 | 11/2008 | Yoshida et al. | |
| 2013/0187987 A1 | 7/2013 | Kubota et al. | |
| 2013/0328026 A1 | 12/2013 | Bhansali et al. | |
| 2015/0138626 A1 | 5/2015 | Kwon et al. | |
| 2017/0190926 A1 | 7/2017 | De Saint-Romain | |

FOREIGN PATENT DOCUMENTS

| | | | | |
|---|---|---|---|---|
| CN | 101080324 | * | 11/2007 | ............... B41J 2/06 |
| CN | 101144931 | | 3/2008 | |
| CN | 103026607 | | 4/2013 | |
| CN | 104350625 | | 2/2015 | |
| CN | 105419482 | | 3/2016 | |
| CN | 106795387 | | 5/2017 | |
| JP | 2003-90909 | | 3/2003 | |
| JP | 2003-185829 | | 7/2003 | |
| JP | 2007172207 | * | 7/2007 | ............. G06K 17/00 |
| JP | 2010-36548 | | 2/2010 | |
| JP | 2010-114161 | | 5/2010 | |
| KR | 10-2006-0100600 | | 9/2006 | |
| KR | 10-2013-0071542 | | 7/2013 | |
| KR | 10-1328096 | | 11/2013 | |
| KR | 10-2017-0141305 | | 12/2017 | |
| KR | 10-1812334 | | 1/2018 | |

OTHER PUBLICATIONS

Written Opinion, with English translation, corresponding to International Application No. PCT/KR2019/004128, dated Jul. 15, 2019.

Chinese Office Action for Chinese Patent Application or Patent No. 201980061893.1, dated May 7, 2022.

Chinese Office Action corresponding to Chinese Application No./Patent No. 201980061893.1 dated Dec. 26, 2022.

* cited by examiner

INKJET PRINTING APPARATUS, DIPOLE ALIGNMENT METHOD, AND DISPLAY DEVICE MANUFACTURING METHOD

CROSS-REFERENCE TO RELATED APPLICATION(S)

This application is a national entry of International Application No. PCT/KR2019/004128, filed on Apr. 8, 2019, which claims under 35 U.S.C. § 119(a) and 365(b) priority to and benefits of Korean Patent Application No. 10-2018-0114340, filed on Sep. 21, 2018 in the Korean Intellectual Property Office, the entire contents of which are incorporated herein by reference.

BACKGROUND

1. Technical Field

The disclosure relates to an inkjet printing apparatus, a dipole alignment method, and a display device manufacturing method.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements, and examples of the light emitting elements include light emitting diodes (LEDs) such as organic light emitting diodes (OLEDs) using an organic material as a fluorescent material and inorganic LEDs using an inorganic material as the fluorescent material.

OLEDs use an organic material as a fluorescent material of a light emitting element. Thus, a manufacturing process may be simple, and a display element can have flexible properties. However, organic material may be vulnerable to a high-temperature driving environment and may have relatively low blue light efficiency.

On the other hand, inorganic LEDs using an inorganic semiconductor as a fluorescent material may be durable even in a high-temperature environment and have higher blue light efficiency than OLEDs. An alignment method using a dielectrophoresis method is being developed for a manufacturing process which has been pointed out as a limitation of conventional inorganic LEDs. However, even if the dielectrophoresis method may be used, it may be difficult to align all inorganic LEDs having random orientation directions, and defects due to misalignment may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an inkjet printing apparatus which can easily align orientation directions of dipoles.

Aspects of the disclosure also provide a dipole alignment method with improved alignment accuracy.

Aspects of the disclosure also provide a display device manufacturing method with improved alignment accuracy of light emitting elements.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, an inkjet printing apparatus may comprise a stage, a print head part disposed above the stage, and an electric field generating part that provides an electric field to a space between the stage and the print head part.

The print head part may comprise a print head, and a nozzle that sprays ink including a dipole, the nozzle being extended to the print head.

The electric field generating part may comprise an antenna part which comprises an antenna pattern.

The antenna part may be disposed between the stage and the print head part.

The antenna part may generate a vertical electric field in the space between the stage and the print head part.

The inkjet printing apparatus may further comprise a substrate mounting member disposed on the antenna part, wherein the antenna part may be disposed on the stage and may be surrounded between the stage and the substrate mounting member.

The antenna part may be disposed at a side of the stage.

The antenna part may generate a horizontal electric field in the space between the stage and the print head part.

The dipole may comprise a light emitting element.

The inkjet printing apparatus may further comprise a probe part, and a probe driver driving the probe part.

According to an embodiment of the disclosure, a dipole alignment method may comprise providing an electric field at an area above a target substrate, spraying ink onto the target substrate through the area, the ink including a dipole, and landing the dipole on the target substrate.

The electric field may be provided by an antenna part comprising an antenna pattern.

The spraying of the ink may comprise aligning an orientation direction of the dipole via the electric field.

The target substrate may comprise a first electrode and a second electrode, and the landing of the dipole comprises landing the dipole on the first electrode and the second electrode.

The landing of the dipole may comprise applying alternating current (AC) power to the first electrode and the second electrode.

The spraying of the ink onto the target substrate may be performed using an inkjet printing apparatus.

The inkjet printing apparatus may comprise a stage, a print head part disposed above the stage, and an electric field generating part that provides an electric field to a space between the stage and the print head part.

According to an embodiment of the disclosure, a display device manufacturing method may comprise preparing a base layer on which a first electrode and a second electrode may be disposed, providing an electric field at an area above the base layer, spraying ink onto the base layer through the area, the ink including a light emitting element, and landing the light emitting element between the first electrode and the second electrode.

The base layer may comprise pixels, the first electrode and the second electrode may be disposed in each of the pixels, and the light emitting element may be landed between the first electrode and the second electrode in each of the pixels.

The spraying of the ink may further comprise aligning an orientation direction of the light emitting element via the electric field.

The above and other features and advantages of the invention will become more apparent by describing in detail embodiments thereof with reference to the attached drawings.

According to an embodiment, it may be possible to improve alignment accuracy while easily aligning orientation directions of dipoles. Since the alignment accuracy of light emitting elements may be improved, display defects of a display device can be reduced.

However, the effects of the embodiments are not restricted to the one set forth herein. The above and other effects of the embodiments will become more apparent to one of ordinary skill in the art to which the embodiments pertain by referencing the detailed description of the disclosure given below.

DETAILED DESCRIPTION OF THE EMBODIMENTS

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on another layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The term "overlap" may include layer, stack, face or facing, extending over, extended under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied, all terms used herein including technical and scientific terms have the same meaning generally understood by one of ordinary skill in the art. Also, terms as defined in dictionaries generally used should be understood as having meanings consistent with their meaning in the context of the relevant art and should not be understood as having an ideally or excessively formal meaning unless clearly defined herein.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Figure 1:
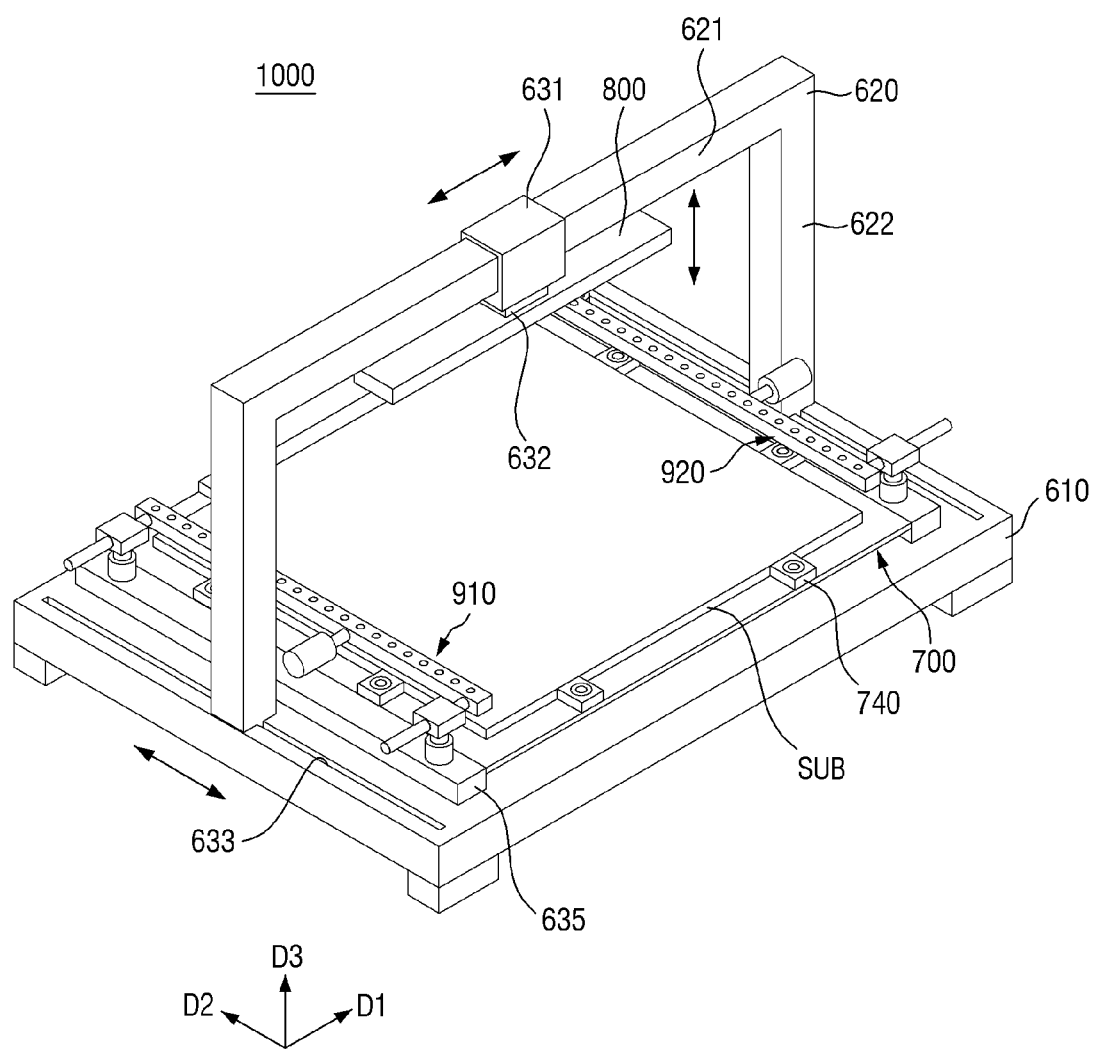
FIG. 1 is a schematic perspective view of an inkjet printing apparatus according to an embodiment.
Figure 2:
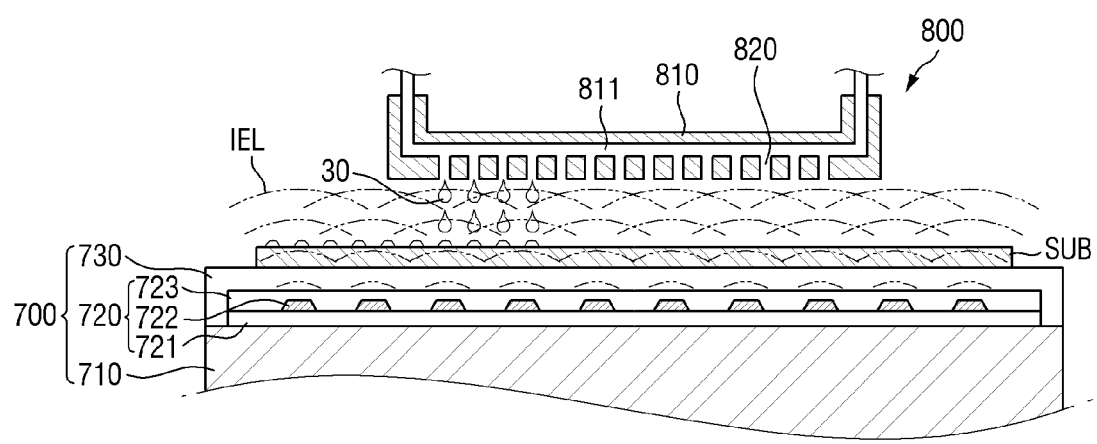
FIG. 2 is a partial schematic cross-sectional view of the inkjet printing apparatus according to an embodiment.
Figure 2:
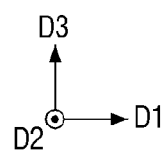
Figure 3:
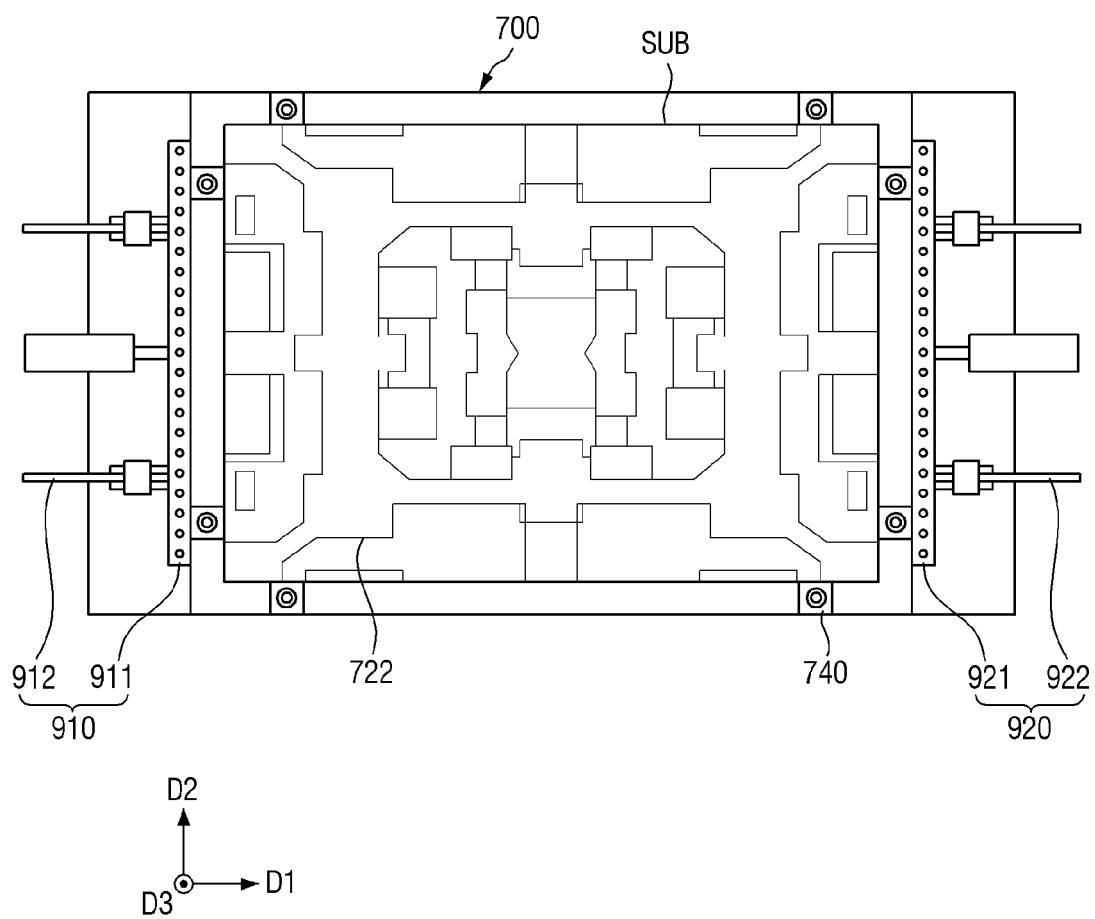
FIG. 3 is a partial schematic plan view of the inkjet printing apparatus according to an embodiment.

FIG. 1 is a schematic perspective view of an inkjet printing apparatus according to an embodiment. FIG. 2 is a partial schematic cross-sectional view of the inkjet printing apparatus according to an embodiment. FIG. 3 is a partial schematic plan view of the inkjet printing apparatus according to an embodiment. In the drawings, a first direction D1, a second direction D2, and a third direction D3 may be defined. The first direction D1 and the second direction D2 may be located in one plane and orthogonal to each other, and the third direction D3 may be perpendicular to each of the first direction D1 and the second direction D2.

Referring to FIGS. 1 through 3, the inkjet printing apparatus 1000 according to an embodiment may include a stage 710 and a print head part 800 positioned above the stage 710 in the third direction D3. The inkjet printing apparatus 1000 may further include a base frame 610, an electric field generating part, a substrate mounting member 730, and a head support 620.

The stage 710 may provide a space in which a target substrate SUB may be disposed. The stage 710 may be disposed on the base frame 610.

The electric field generating part may be disposed on the stage 710. The electric field generating part may be disposed on a back surface of the target substrate SUB and may generate an electric field above the target substrate SUB (the third direction D3), for example, in a space in which a printing process may be performed. In the drawings, an antenna part 720 is illustrated as an example of the electric field generating part. However, the electric field generating part is not limited to the antenna part 720, and electrodes or various other members capable of generating an electric field are applicable.

The antenna part 720 may include a base substrate 721, an antenna pattern 722 disposed on the base substrate 721, and an insulating layer 723 disposed on the antenna pattern 722.

The base substrate 721 may be a printed circuit board or a flexible circuit board or may be an insulating substrate such as polyimide.

The antenna pattern 722 may generate an electric field. Specifically, in case that an electric current flows in response to power provided to the antenna pattern 722, electromagnetic waves may be generated, thereby generating a vertical electric field having a horizontal equipotential surface. The generated electric field may control orientation directions of dipoles 31 included in ink 30. This will be described in detail later.

The planar shape of the antenna pattern 722 may be advantageous in generating a uniform electric field in case that it is a shape in which the antenna pattern 722 is generally evenly spread in plan view as illustrated in FIG. 3. The antenna pattern 722 may have a size and shape that allow it to cover the entire target substrate SUB so as to generate an electric field over the entire target substrate SUB. In a rectangular target substrate SUB, corners may have different characteristics from other areas. To make up for this, the shape of the antenna pattern 722 may be designed such that an electric field at the corners of the target substrate SUB may be equal to or larger than an electric field in other areas. For example, the antenna pattern 722 may be formed in a shape corresponding to the corners of the target substrate SUB, or the density of the antenna pattern 722 at the corners may be increased, so that the intensity of the electric field may not be reduced in these areas.

The planar shape of the antenna pattern 722 may be, but is not limited to, a closed loop shape, multiple closed loop shapes, an open loop shape, a rectangular shape, a polygonal shape, a circular shape, a spiral shape wound around the center, a coil shape, or a combination thereof.

The antenna pattern 722 may be made of a conductive material such as silver (Ag), copper (Cu), or a combination thereof.

The cover layer 723 covers the antenna pattern 722. The cover layer 723 may include an inorganic insulating layer such as a silicon oxide layer, a silicon nitride layer, a silicon oxynitride layer, an organic insulating material, or a combination thereof. At least one of the base substrate 721 and the cover layer 723 may further include a magnetic substance, but the disclosure is not limited thereto.

The substrate mounting member 730 may be disposed on the antenna part 720. The substrate mounting member 730 may cover the electric field generating part. For a printing process, the target substrate SUB may be mounted on the substrate mounting member 730. A substrate aligner 740 may be installed on the substrate mounting member 730 to align the target substrate SUB. The substrate mounting member 730 may be made of a quartz or ceramic material and provided in the form of an electrostatic chuck, but the disclosure is not limited thereto.

An edge part of the substrate mounting member 730 may contact the stage 710, and accordingly, the electric field generating part may be surrounded by the substrate mounting member 730 and the stage 710. In some embodiments, the substrate mounting member 730 may be manufactured integrally with the stage 710. In case that a part providing a space in which the target substrate SUB is mounted is defined as a stage part 700, the stage part 700 may include the antenna part 720 and/or the substrate mounting member 730 in addition to the stage 710. The antenna part 720 may be understood as being built in the stage part 700.

The overall planar shape of the stage part 700 may follow the planar shape of the target substrate SUB. For example, in case that the target substrate SUB is rectangular, the overall shape of the stage part 700 may be a rectangular shape. In case that the target substrate SUB is circular, the overall shape of the stage part 700 may be a circular shape. In the drawings, the stage part 700 is illustrated as having a rectangular shape whose long sides may be disposed in the first direction D1 and short sides may be disposed in the second direction D2.

The print head part 800 may serve to print the ink 30 on the target substrate SUB. The inkjet printing apparatus 1000 may further include an ink providing part such as an ink cartridge and may spray (eject) the ink 30 supplied from the ink providing part toward the target substrate SUB through the print head part 800. The ink 30 may be provided in a solution state. The ink 30 may include, for example, a solvent 32 (see FIG. 4A) and of dipoles 31 (see FIG. 4A) included in the solvent 32. The solvent 32 may be acetone, water, alcohol, toluene, or the like, or a combination thereof. The solvent 32 may be a material that may be vaporized or volatilized at room temperature or by heat. The dipoles 31 may be dispersed in the solvent 32. The dipoles 31 may be a solid material ultimately remaining on the target substrate SUB after the solvent 32 may be removed.

Each of the dipoles 31 may be an object including an end having a first polarity and another end having a second polarity different from the first polarity. For example, an end of each dipole 31 may have a positive polarity, and another end of each dipole 31 may have a negative polarity. Each dipole 31 having different polarities at both ends may be subjected to electrical forces (attractive and repulsive forces) in case placed in an electric field generated by the antenna part 720. Accordingly, the orientation directions of the dipoles 31 may be controlled.

Each of the dipoles 31 may extend in one direction. The dipoles 31 may be shaped like nanorods, nanowires, nanotubes, or the like. As the dipoles 31 included in the ink 30 according to an embodiment, semiconductor nanorods, each having an end doped with impurities of a first conductivity type (e.g., a p type) and another end doped with impurities of a second conductivity type (e.g., an n type), may be applied.

The print head part 800 may be disposed above the substrate mounting member 730. The print head part 800 may be mounted on the head support 620 and spaced apart from the substrate mounting member 730 by a distance. The head support 620 may include a horizontal support part 621 extending in a horizontal direction and a vertical support part 622 extended to the horizontal support part 621 and extending in the third direction D3 which may be a vertical direction. The direction in which the horizontal support part 621 extends may be the same as the first direction D1 which may be a long side direction of the stage part 700. An end of the vertical support part 622 may be placed on the base frame 610. The print head part 800 may be mounted on the horizontal support part 621 of the head support 620.

The distance between the print head part 800 and the substrate mounting member 730 may be adjusted by a height of the head support 620. The distance between the print head part 800 and the substrate mounting member 730 may be adjusted within a range that allows the print head part 800 to be spaced apart from the target substrate SUB by a certain distance to secure a process space in case that the target substrate SUB is mounted on the substrate mounting member 730.

The print head part 800 may include a print head 810 and nozzles 820 located on a bottom surface of the print head 810. The print head 810 may extend along a direction. The direction in which the print head 810 extends may be the same as the direction in which the horizontal support part 621 of the head support 620 extends. For example, the direction in which the print head 810 extends may be the first direction D1 which may be the long side direction of the stage part 700. The print head 810 may include an internal tube 811 formed along its extending direction. The nozzles 820 may be arranged along the extending direction of the print head 810. The nozzles 820 may be arranged in one row or multiple rows. In an embodiment, the number of the nozzles 820 included in one print head part 800 may be, but is not limited to, about 128 to about 1800.

Each nozzle 820 may be extended to the internal tube 811 of the print head 810. The ink 30 may be supplied to the internal tube 811 of the print head 810, and the supplied ink 30 may flow along the internal tube 811 and be sprayed through each nozzle 820. The ink 30 sprayed through the nozzles 820 may be supplied to an upper surface of the target substrate SUB. The amount of the ink 30 sprayed through the nozzles 820 may be adjusted according to the voltage applied to the individual nozzles 820. In an embodiment, a single ejection amount of each nozzle 820 may be, but is not limited to, about 1 picoliter (pl) to about 50 picoliters (pl).

Although one print head part 800 is illustrated in the drawings, the disclosure is not limited thereto. For example, in the case of a process of providing multiple inks 30 to the target substrate SUB, a number of print head parts 800 equal to the number of types of the inks 30 may be disposed.

The inkjet printing apparatus 1000 may further include a moving part which moves the print head part 800 and/or the stage part 700.

A print head moving part which may move the print head part 800 may include a first horizontal moving part 631, a second horizontal moving part 633, and a vertical moving part 632. The first horizontal moving part 631 may move the print head part 800 on the horizontal support part 621 in the first direction D1, and the second horizontal moving part 633 may move the vertical support part 622 in the second direction D2 to move the print head part 800 mounted on the head support 620 in the second direction D2. Through the horizontal movement by the first horizontal moving part 631 and the second horizontal moving part 633, the ink 30 can be sprayed to the entire area of the target substrate SUB even with the print head part 800 having a smaller area than the target substrate SUB. The first horizontal moving part 631 may be installed on the horizontal support part 621, and the second horizontal moving part 633 may be installed on the base frame 610. The vertical moving part 632 on the horizontal support part 621 may adjust the distance between the print head part 800 and the target substrate SUB by raising and lowering the position of the print head part 800 in the vertical direction.

A stage moving part 635 which may move the stage part 700 may move the stage part 700 in the second direction D2. The stage moving part 635 may be installed on the base frame 610. In case that the stage moving part 635 exists, the second horizontal moving part 633 of the print head moving part can be omitted. For example, the print head part 800 may reciprocate in the first direction D1, and the stage part 700 may move in the second direction D2 to perform a printing process on the entire area of the target substrate SUB.

The inkjet printing apparatus 1000 may further include probe devices 910 and 920. The probe devices 910 and 920 may include probe parts 911 and 921 and probe drivers 912 and 922. The probe drivers 912 and 922 may move the probe parts 911 and 922 and include driving cylinders or driving motors, but the disclosure is not limited thereto.

The probe parts 911 and 921 and the probe drivers 912 and 922 may be disposed on at least one side of the stage part 700 (or the target substrate SUB). For example, one probe part and a probe driver driving the probe part may be disposed adjacent to the outside of a side of the stage part 700. However, the disclosure is not limited thereto, and multiple probe parts and multiple probe drivers may also be disposed. In the drawings, two probe parts 911 and 921 and two probe drivers 912 and 922 may be disposed.

As illustrated in the drawings, the probe devices may include a first probe part 911 and a first probe driver 912 disposed adjacent to the outside of a first short side of the stage part 700 and a second probe part 921 and a second probe driver 922 disposed adjacent to the outside of a second short side of the stage part 700.

Each of the first and second probe parts 911 and 921 may extend in the second direction D2 and include probes. Lengths of the first and second probe parts 911 and 921 in the extending direction may cover the entire target substrate SUB. Each probe of the first and second probe parts 911 and 921 may contact an electrode pad of the target substrate SUB and provide a voltage, e.g., an alternating current (AC) voltage. Voltage application by the first and second probe parts 911 and 921 may be performed simultaneously or sequentially. The first and second probe drivers 912 and 922 may be disposed outside the first and second probe parts 911 and 921 and may move the first and second probe parts 911 and 921 in the first direction D1 which may be the horizontal direction and the third direction D3 which may be the vertical direction. In an embodiment, each of the first and second probe parts 911 and 921 may be disposed on the stage moving part 635. However, the disclosure is not limited thereto, and each of the first and second probe parts 911 and 921 may also be disposed on the base frame 610 or disposed as a separate device.

Figure 4A:
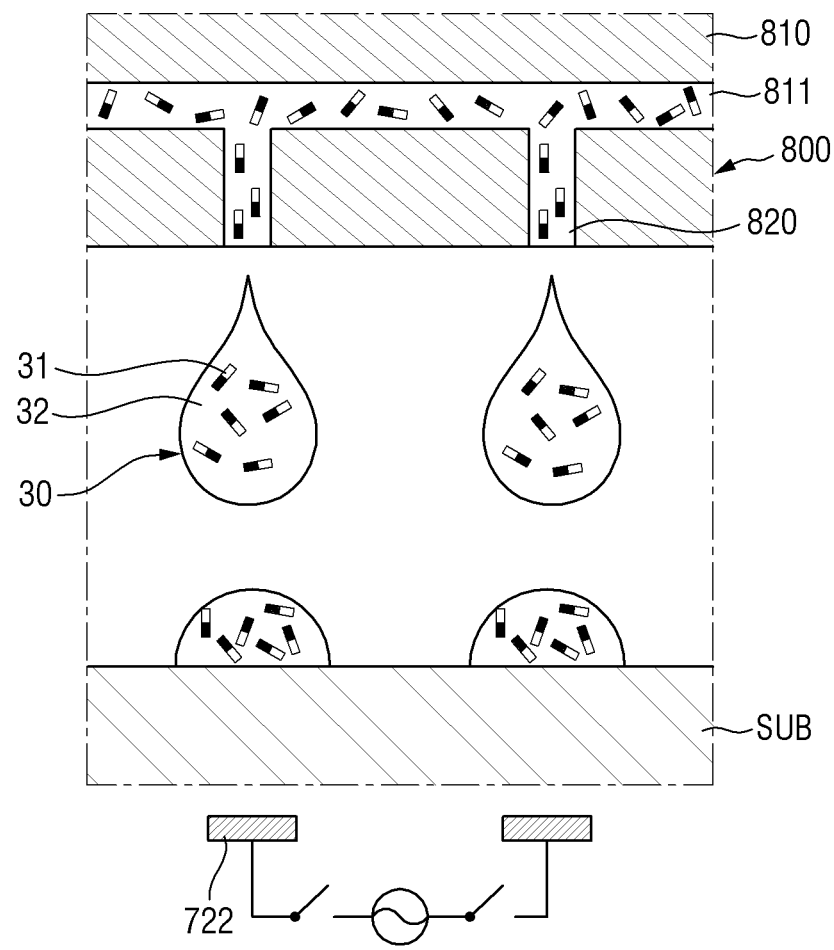
FIGS. 4A and 4B are partial schematic cross-sectional views illustrating orientation directions of dipoles in ink according to the operation of an antenna part in the inkjet printing apparatus according to an embodiment.
Figure 4B:
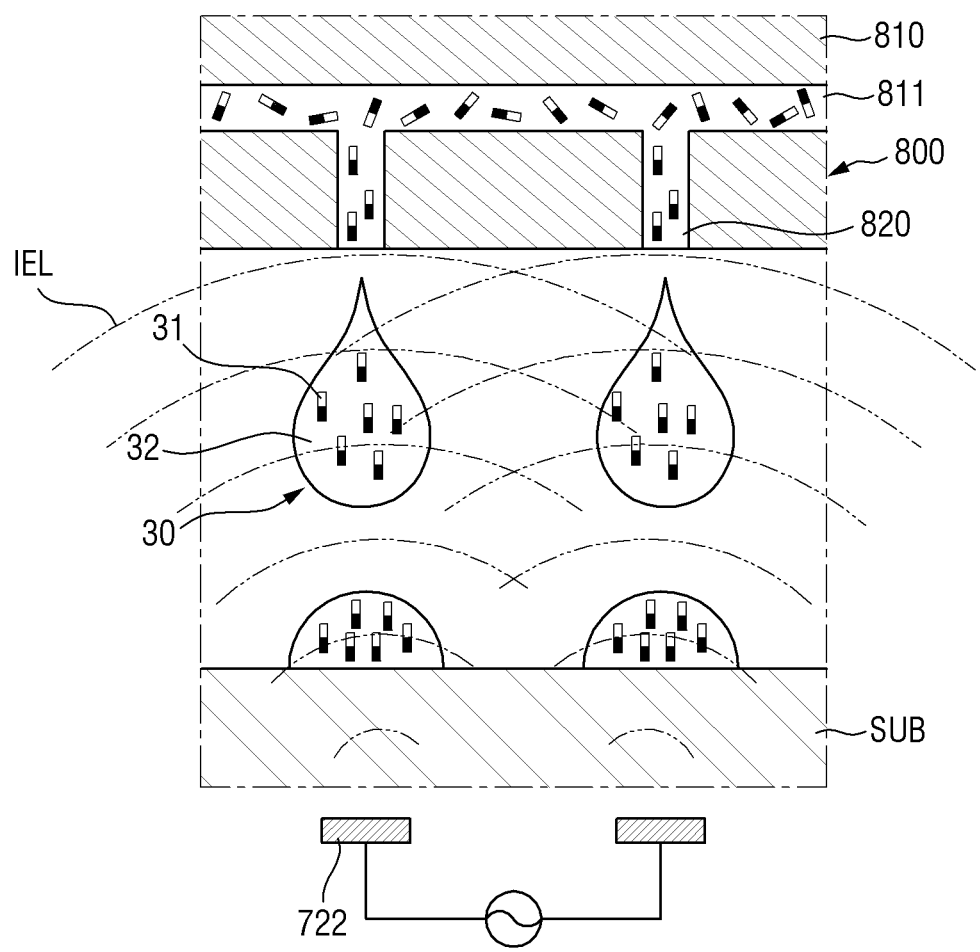

FIGS. 4A and 4B are partial schematic cross-sectional views illustrating orientation directions of dipoles in ink according to the operation of the antenna part in the inkjet printing apparatus according to an embodiment. For ease of description, the detailed cross-sectional structure of the stage part 700 excluding the antenna pattern 722 is not illustrated in FIGS. 4A and 4B.

The dipoles 31 inside the ink 30 may have random orientation directions in case that no external force acts. As illustrated in FIG. 4A, in case that an electric field is not generated because power is not applied to the antenna pattern 722 of the antenna part 720, the orientation directions of the dipoles 31 may not be aligned in a specific direction from the print head 810 to the target substrate SUB. While the dipoles 31 may land on the target substrate SUB by a subsequent process of landing the dipoles 31, for example, by a dielectrophoresis method, the orientation directions may be aligned in a certain direction to some degree. However, in case that the orientation directions are random in a state where the dipoles 31 may be sprayed onto the target substrate SUB, misalignment may occur, or it may take a long time for alignment because there may be a difference in the degree to which the orientation direction of each dipole 31 may be changed.

As illustrated in FIG. 4B, in case that an electric field is generated above the target substrate SUB because power is applied to the antenna pattern 722 of the antenna part 720, the ink 30 may be affected by the electric field from the nozzles 820 of the print head 810 to the target substrate SUB. In case that the dipoles 31 in the ink 30 may be placed inside the electric field, their orientation directions may be directed to the direction of the electric field by an electric force. In case that the electric field generated by the antenna pattern 722 is a vertical electric field having a horizontal equipotential line IEL as illustrated in the drawing, the dipoles 31 placed in the electric field may also tend to be generally oriented in the vertical direction. In case that a landing process is performed on the dipoles 31 aligned in a specific direction, the degrees to which the orientation directions of the dipoles 31 may be changed become similar compared with the dipoles 31 having random orientation directions. Therefore, the dipoles 31 can be rapidly aligned with improved accuracy.

The degree of orientation alignment of the dipoles 31 in the ink 30 sprayed onto the substrate before the landing process may be generally proportional to the time of exposure to the electric field and the magnitude of the electric field. An effective time during which the dipoles 31 may be exposed to the electric field may be calculated using the following equation.

$$\text{Effective Time} = H_{distance}/V_{drop,jet}$$

In the above equation, Hdistance may represent the distance between a print head and a target substrate, and Vdrop,jet may represent the jetting speed of ink droplets.

The distance between the print head 810 and the target substrate SUB may be about 0.3 mm to about 1 mm, and the jetting speed of ink droplets may be about 5 m/s to about 10 m/s. The effective time during which the dipoles 31 may be exposed to the electric field may be about 60 us to about 200 us. In case that the effective time during which the dipoles 31 are exposed to the electric field is determined as described above, a desired degree of orientation alignment of the dipoles 31 may be secured by adjusting the magnitude of the electric field, which may be another variable regarding the orientation alignment, based on the effective time.

Figure 5:
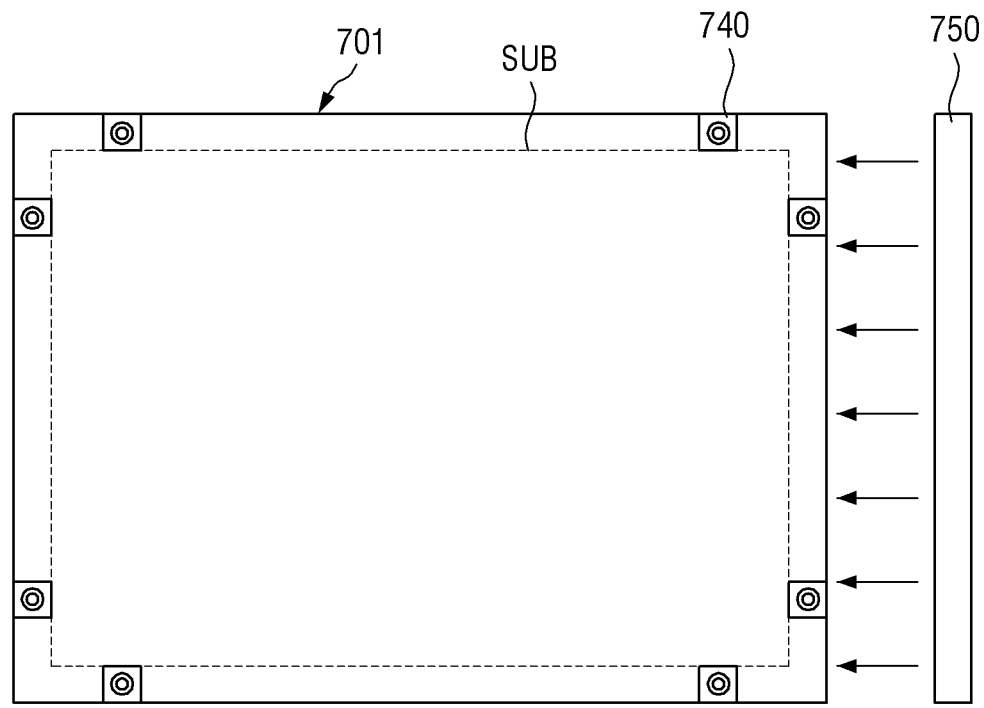
FIG. 5 is a partial schematic plan view of an inkjet printing apparatus according to another embodiment.
Figure 6:
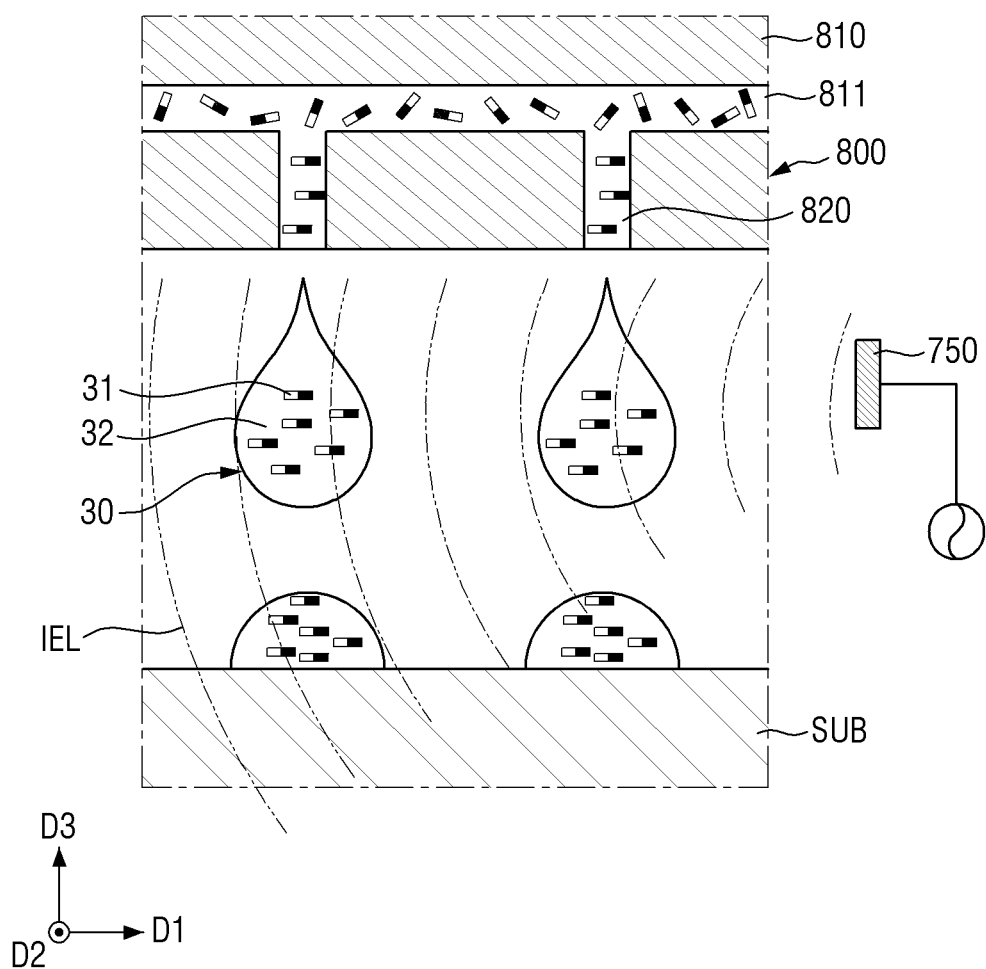
FIG. 6 is a partial schematic cross-sectional view illustrating orientation directions of dipoles in ink according to the operation of an antenna part in the inkjet printing apparatus of FIG. 5.

FIG. 5 is a partial schematic plan view of an inkjet printing apparatus according to another embodiment. In FIG. 5, the planar arrangement of a stage and an antenna part is illustrated, and other members are not illustrated for ease of description. FIG. 6 is a partial schematic cross-sectional view illustrating orientation directions of dipoles in ink according to the operation of the antenna part in the inkjet printing apparatus of FIG. 5.

Referring to FIGS. 5 and 6, the inkjet printing apparatus according to an embodiment may be different from an embodiment of FIGS. 1 through 3 in that the antenna part 750 may be disposed on a side of a target substrate SUB (or on a side of a stage part 701 or a print head 810).

The antenna part 750 may be, for example, disposed outside a short side of the stage part 701. The antenna part 750 may be disposed to cover the whole of a short side of at least the target substrate SUB. In an embodiment, the antenna part 750 may be shaped like a bar extending in the second direction D2.

In case that the antenna part 750 receives power, it may generate electromagnetic waves, thereby generating an electric field in a lateral direction toward the target substrate SUB. For example, a horizontal electric field having a vertical equipotential line IEL may be generated between the print head 810 and the target substrate SUB. Accordingly, in case that the ink 30 is sprayed from the print head 810, the dipoles 31 included in the ink 30 may be affected by the electric field, and thus their orientation directions may be generally directed to the horizontal direction. In case that a landing process is performed on the dipoles 31 aligned in a specific direction, the alignment accuracy of the landed dipoles 31 may be improved as described above. Further, in case that the landing process is intended to orient the dipoles 31 in the horizontal direction, alignment accuracy and speed may be further improved because the dipoles 31 may be aligned in generally similar orientation directions before the landing process.

The number and arrangement of the antenna parts 750 that generate a horizontal electric field are not limited to those illustrated in FIG. 5 but can be variously changed. This will be described in detail with reference to FIGS. 7A through 7E.

FIGS. 7A through 7E are partial schematic plan views of inkjet printing apparatuses according to various embodiments.

Figure 7A:
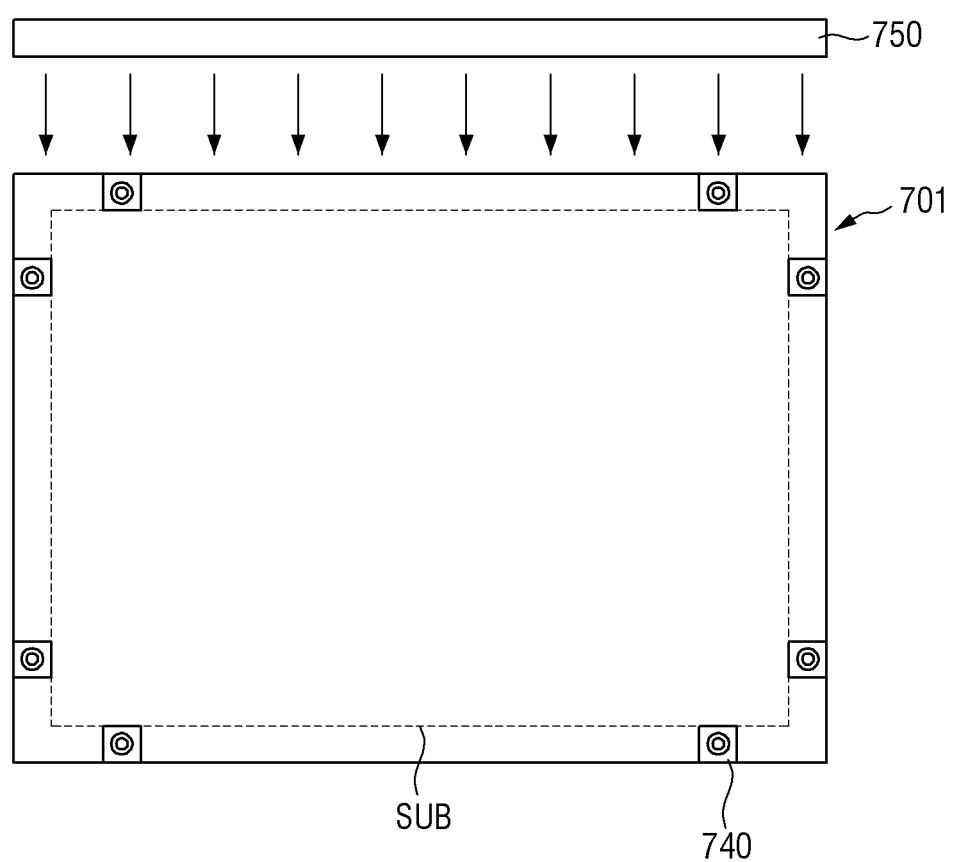
FIGS. 7A through 7E are partial schematic plan views of inkjet printing apparatuses according to various embodiments.
Figure 7B:
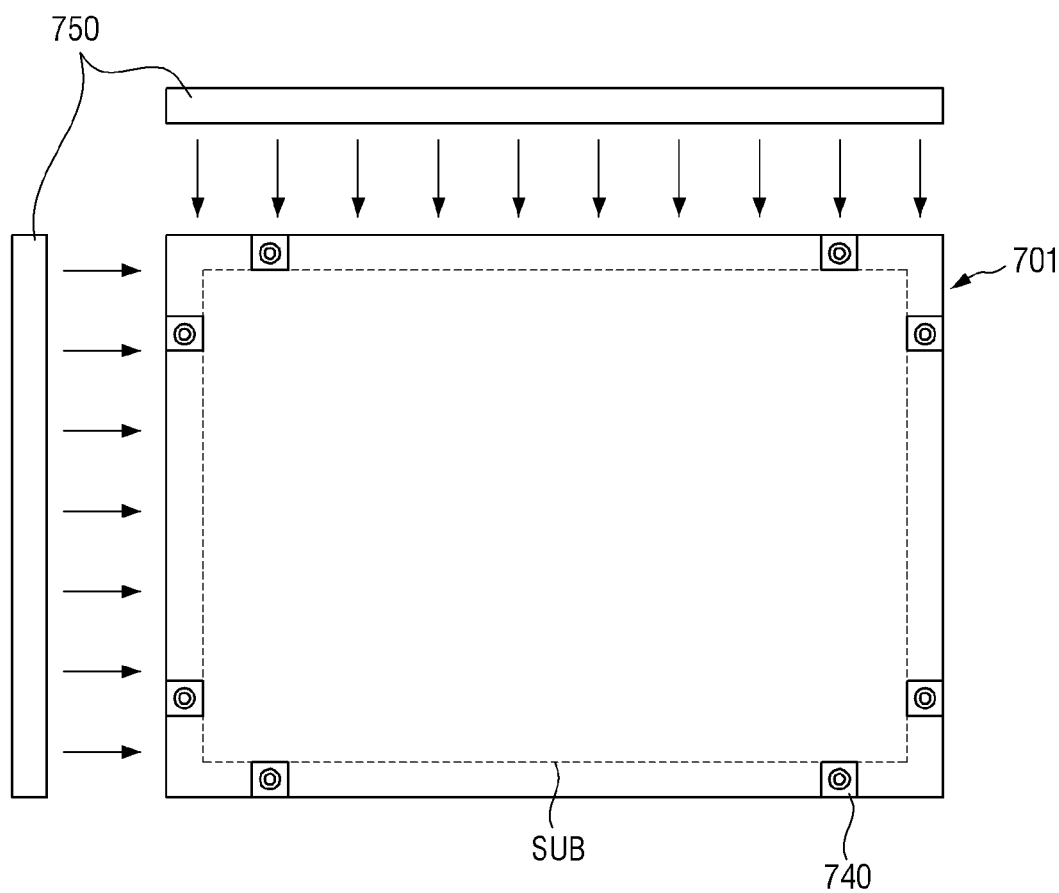
Figure 7C:
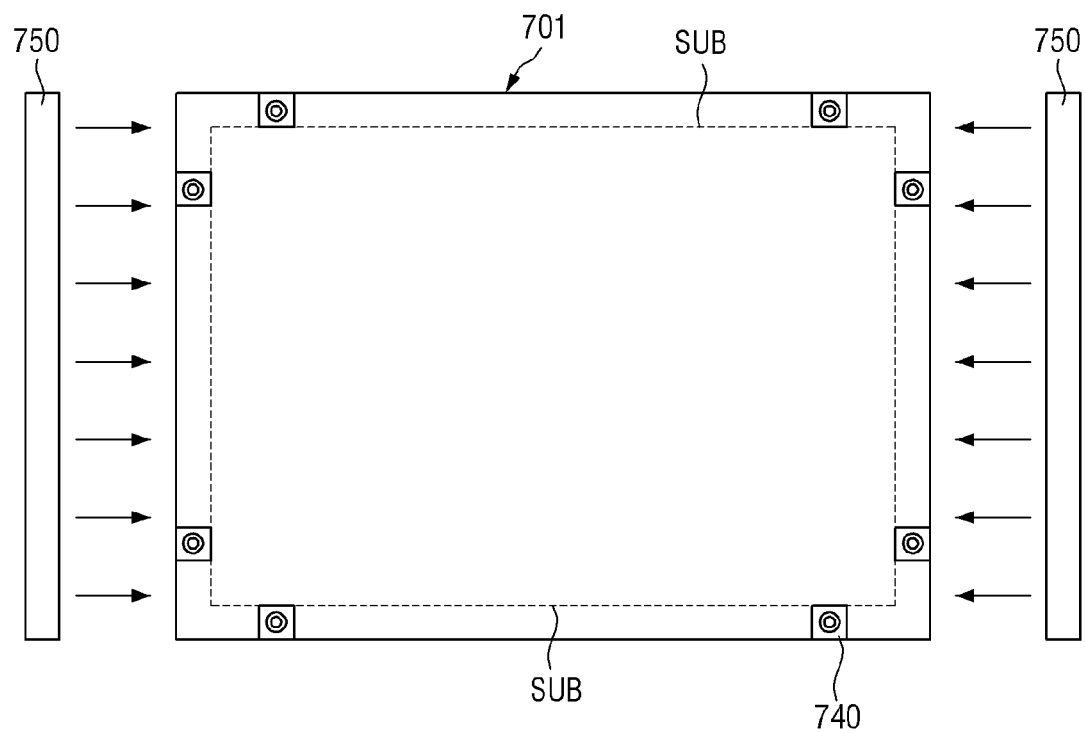
Figure 7D:
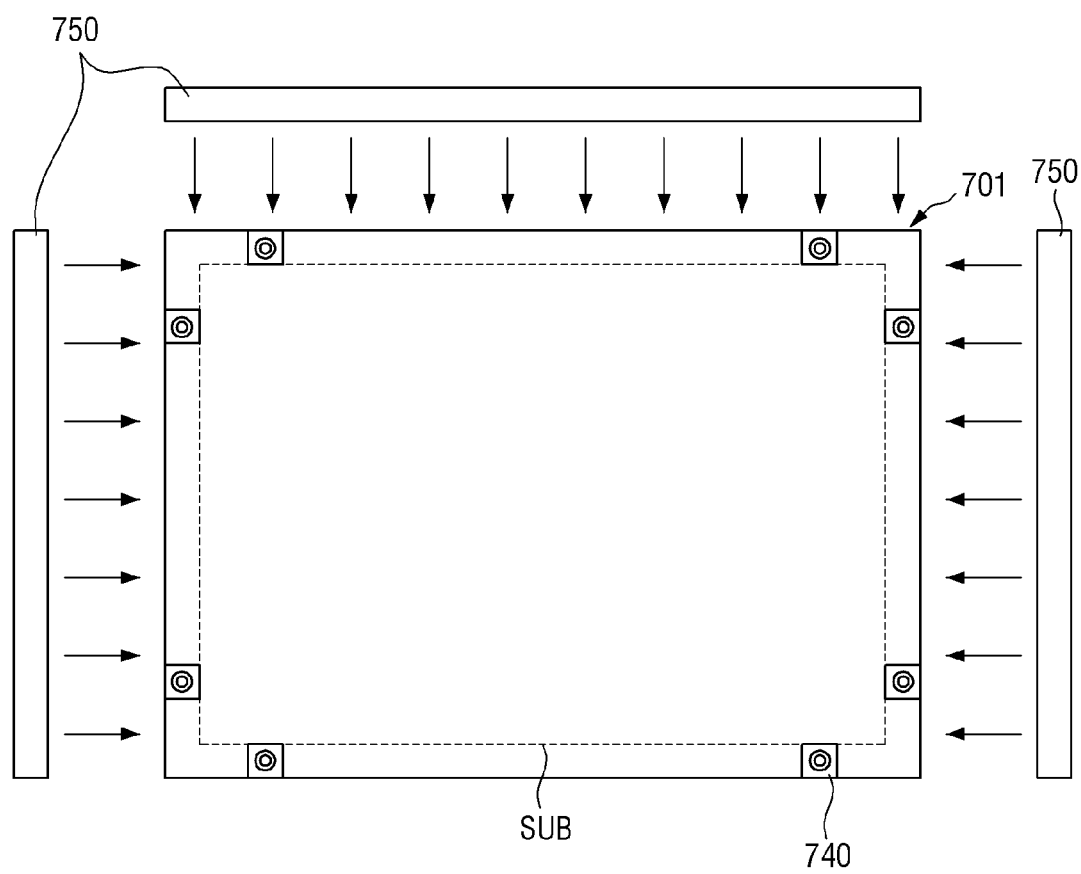
Figure 7E:
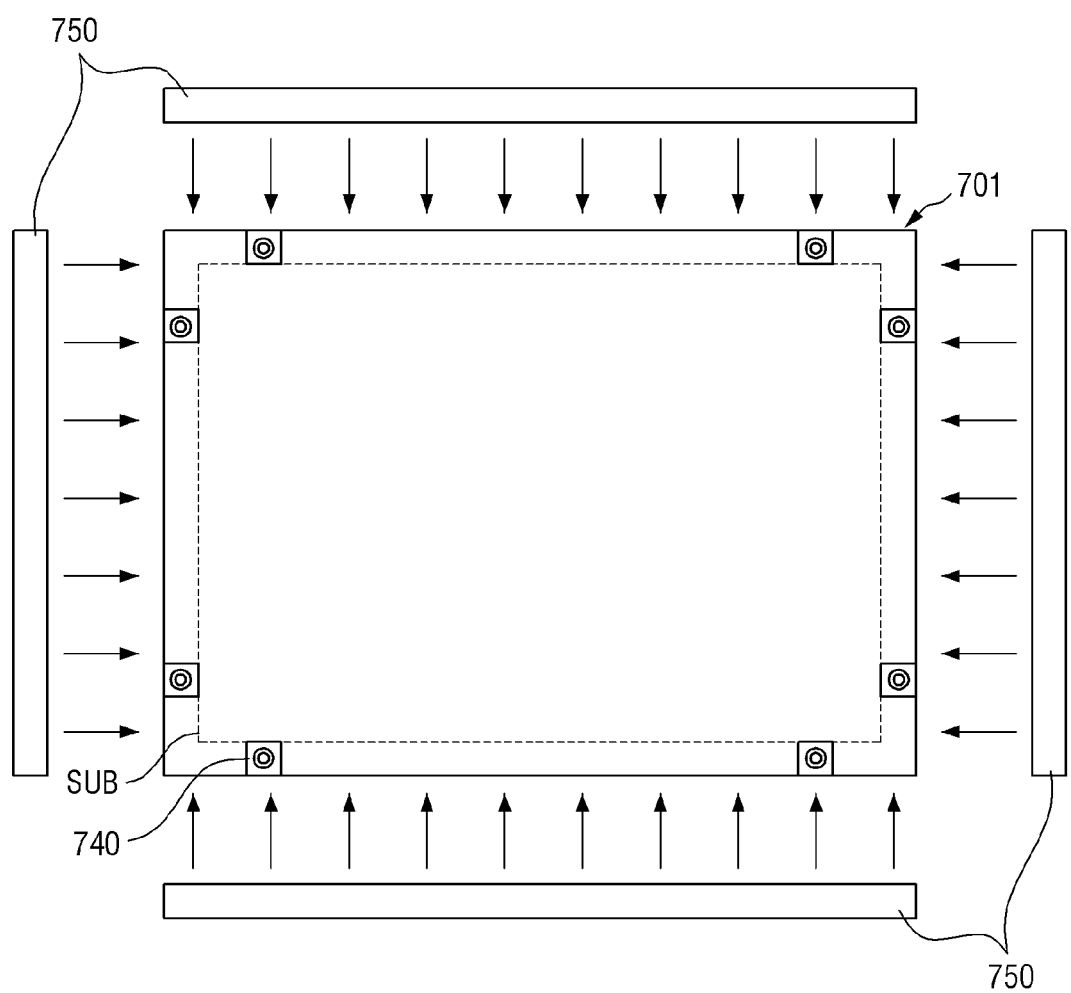

FIG. 7A illustrates a case where an antenna part 750 may be disposed outside a long side of a stage part 701. FIG. 7B illustrates a case where two antenna parts 750 may be disposed outside a long side and a short side of a stage part 701, respectively. FIG. 7C illustrates a case where two antenna parts 750 may be disposed outside facing sides (short sides in the drawing) of a stage part 701. FIG. 7D illustrates a case where three antenna parts 750 may be disposed outside three sides of a stage part 701, and FIG. 7E illustrates a case where four antenna parts 750 may be disposed outside four sides of a stage part 701, respectively. As the number of antenna parts 750 that generate a horizontal electric field increases, a difference in electric field between areas may be reduced. An electric field in a specific area may be expressed as the vector sum of electric fields respectively generated from multiple antenna parts 750.

Figure 8:
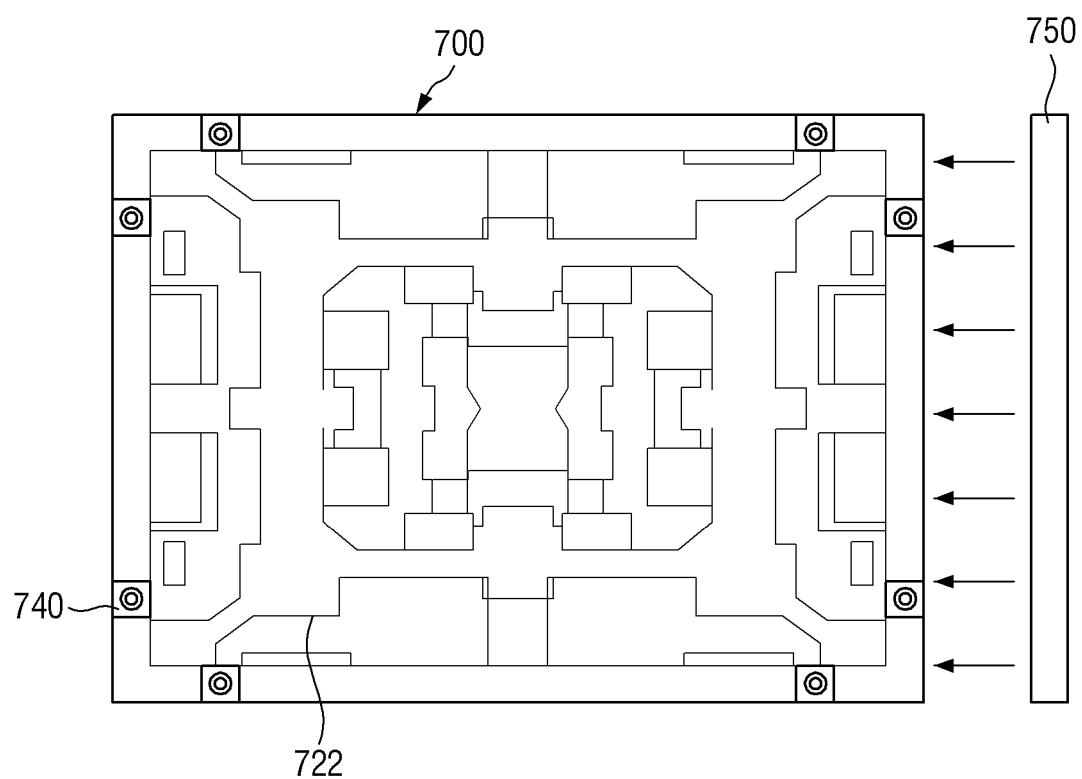
FIG. 8 is a partial schematic plan view of an inkjet printing apparatus according to another embodiment.
Figure 9:
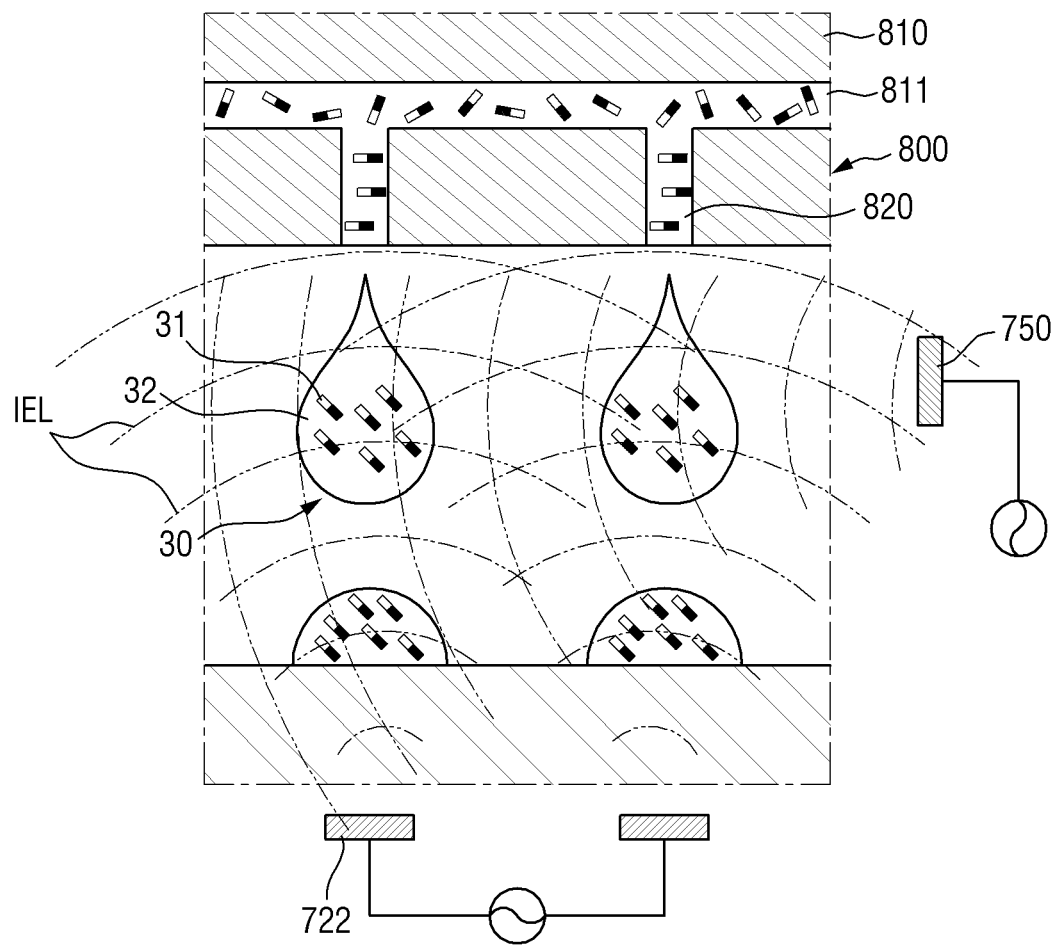
FIG. 9 is a partial schematic cross-sectional view illustrating orientation directions of dipoles in ink according to the operation of an antenna part in the inkjet printing apparatus of FIG. 8.

FIG. 8 is a partial schematic plan view of an inkjet printing apparatus according to another embodiment. FIG. 9 is a partial schematic cross-sectional view illustrating orientation directions of dipoles in ink according to the operation of an antenna part in the inkjet printing apparatus of FIG. 8.

Referring to FIGS. 8 and 9, the inkjet printing apparatus according to an embodiment may be different from the previous embodiments in that it may include both a first antenna part 720 generating a vertical electric field and a second antenna part 750 generating a horizontal electric field. For example, an embodiment may be substantially the same as a structure obtained by adding the antenna part 750 generating a horizontal electric field as illustrated in FIG. 5 to the inkjet printing apparatus according to an embodiment of FIGS. 1 through 3.

In an embodiment, both the vertical electric field of the first antenna part 720 and the horizontal electric field of the second antenna part 750 may act in a space between a print head 810 and a target substrate SUB to form an electric field according to the vector sum of the vertical and horizontal electric fields. Accordingly, the orientation directions of the dipoles 31 in the ink 30 sprayed onto the target substrate SUB may be generally aligned in an inclined direction between the vertical direction and the horizontal direction. In case that a landing process is performed on the dipoles 31 aligned in a specific direction as described above, the degrees to which the orientation directions of the dipoles 31 may be changed become similar compared with the dipoles 31 having random orientation directions. Therefore, the dipoles 31 can be rapidly aligned with improved accuracy.

In the above-described embodiment, the inkjet printing apparatus has been described as an example of an applying apparatus. However, various apparatuses for applying a liquid solution such as an inkjet injection apparatus, a slot-die coating apparatus, and a slot-die printing apparatus are applicable as long as the technical spirit is shared.

A dipole alignment method using an inkjet printing apparatus according to the various embodiments described above will now be described.

Figure 10:
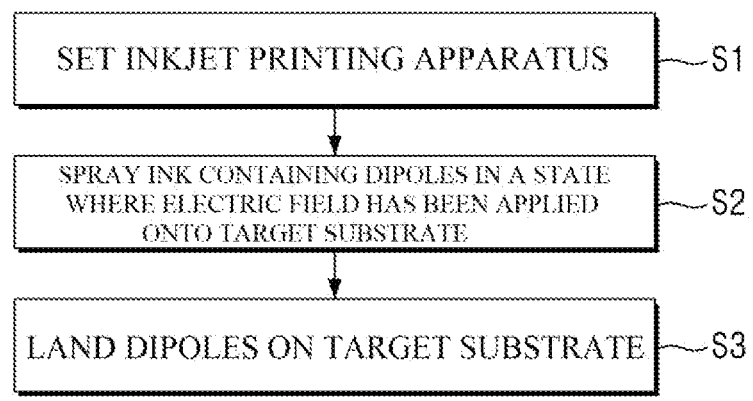
FIG. 10 is a flowchart schematically illustrating a dipole alignment method according to an embodiment.

FIG. 10 is a flowchart schematic illustrating a dipole alignment method according to an embodiment. FIGS. 11 through 14 are schematic cross-sectional views respectively illustrating operations in the dipole alignment method according to an embodiment.

Referring to FIGS. 1 through 4B and 10, the dipole alignment method may include setting an inkjet printing apparatus (operation S1), spraying ink containing dipoles in a state where an electric field has been applied onto a target substrate (operation S2), and landing the dipoles on the target substrate (operation S3).

The setting of the inkjet printing apparatus (operation S1) may be an operation of tuning an inkjet printing apparatus 1000 according to a target process. For precise tuning, an inkjet printing test process may be performed on a substrate for inspection, and set values of the inkjet printing apparatus 1000 may be adjusted according to the result of the process.

Specifically, a substrate for inspection may be prepared first. The substrate for inspection may have the same structure as a target substrate SUB, but a bare substrate such as a glass substrate may also be used.

An upper surface of the substrate for inspection may be treated with a water repellent. The water-repellent treatment may be performed by fluorine coating or plasma surface treatment.

Ink 30 containing dipoles 31 may be applied to the upper surface of the substrate for inspection using the inkjet printing apparatus 1000, and the amount of droplets for each nozzle 820 may be measured. The amount of droplets for each nozzle 820 may be measured by checking sizes of droplets at the time of spraying and sizes of the droplets applied to the substrate using a camera. In case that the measured amount of droplets is different from a reference amount of droplets, a voltage for each corresponding nozzle 820 may be adjusted so that the reference amount of droplets can be sprayed. This inspection method may be repeated a number of times until each nozzle 820 sprays a correct amount of droplets.

The setting of the inkjet printing apparatus (S1) described above can be omitted.

Figure 11:
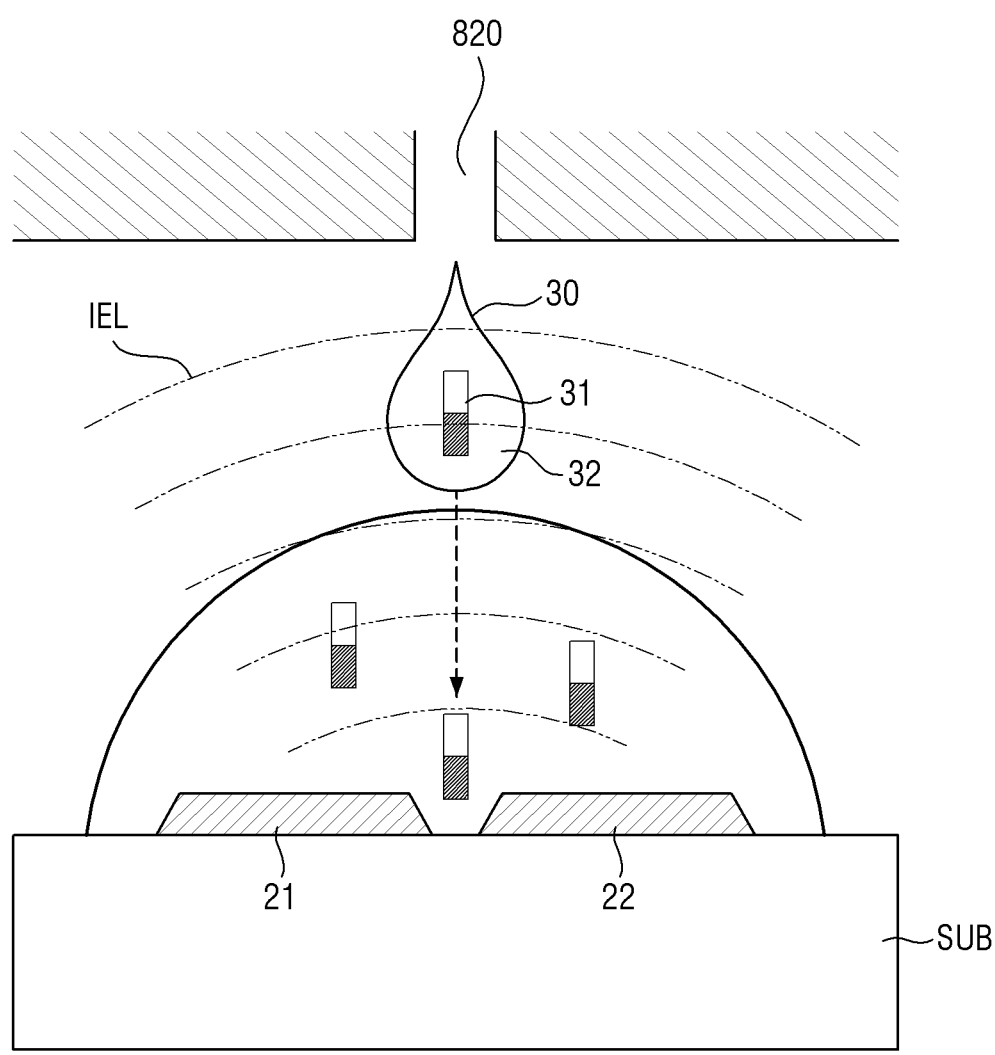
FIGS. 11 through 14 are schematic cross-sectional views respectively illustrating operations in the dipole alignment method according to an embodiment.

When the setting of the inkjet printing apparatus 1000 is completed, the ink 30 containing the dipoles 31 may be sprayed onto the target substrate SUB as illustrated in FIG. 11 (operation S2). A first electrode 21 and a second electrode 22 may be formed on the target substrate SUB, and the ink 30 may be sprayed onto the first and second electrodes 21 and 22. Here, in case that a vertical electric field is generated using an antenna part 720 as described above, orientation directions of the dipoles 31 may be generally aligned in the vertical direction as the ink 30 passes through an area where the electric field may be generated. Although the ink 30 may be sprayed onto a pair of electrodes in the drawing, a larger number of electrode pairs may be formed on the target substrate SUB, and the ink 30 may be sprayed to each electrode pair in the same manner as multiple nozzles 820 of a print head part 800 move.

Figure 12:
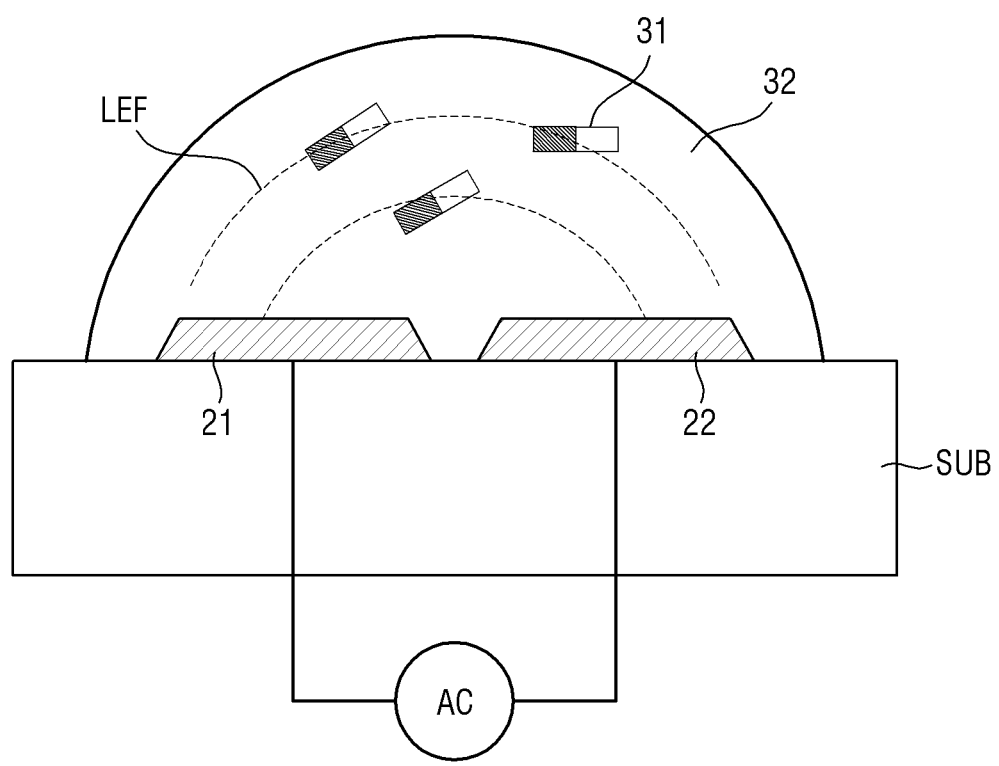

The landing of the dipoles 31 on the target substrate SUB may be performed. The landing of the dipoles 31 may be performed by a dielectrophoresis method. Specifically, as illustrated in FIG. 12, an AC voltage may be applied to the first electrode 21 and the second electrode 22. The applied AC voltage may have a voltage of about ±(10 to 50) V and a frequency of about 10 kHz to about 1 MHz.

Voltage (e.g., AC voltage) may be applied using a probe device illustrated in FIG. 1. The probe device may further include a function generator and an amplifier for generating an appropriate AC voltage. For example, a signal reflecting a desired AC waveform and frequency may be generated by the function generator and amplified to an appropriate voltage by the amplifier. The AC voltage may be provided to each probe of a probe part.

Each of the first electrode 21 and the second electrode 22 may be electrically connected to an electrode pad provided on at least one side of the target substrate SUB, and the AC voltage may be applied to the electrode pad through the probe part of the probe device. In case that the probe device includes a first probe part 911 and a second probe part 921, the electrode pads of the first electrode 21 and the second electrode 22 may also be provided on both sides of the target substrate SUB. The electrode pad on one side may receive the AC voltage from the first probe part 911, and the electrode pad on another side may receive the AC voltage from the second probe part 921. The first probe part 911 and the second probe part 921 may simultaneously apply the AC voltage, or the first probe part 911 and the second probe part 921 may sequentially apply the AC voltage.

Figure 13:
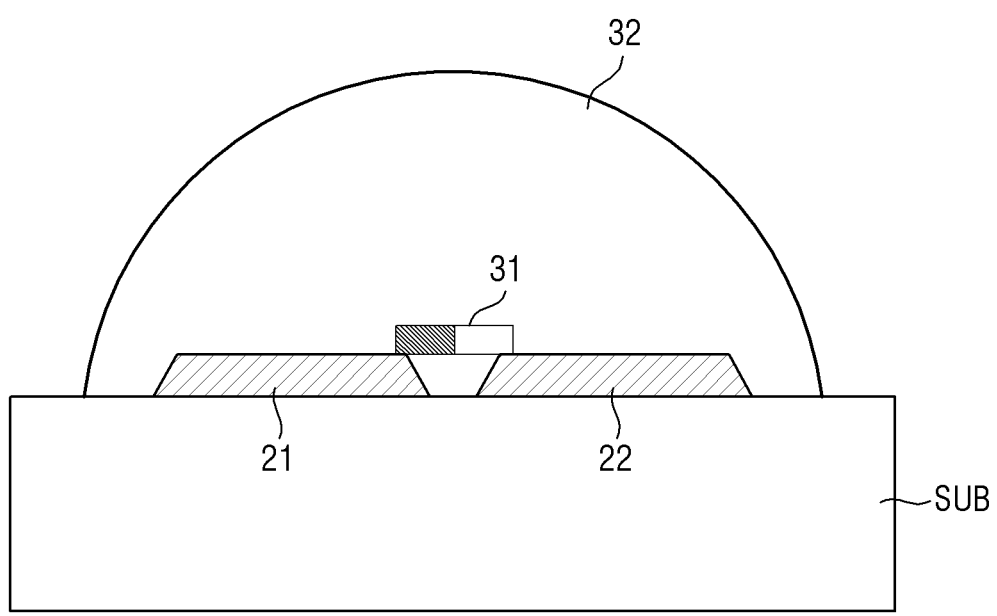

When the AC voltage is applied to the first electrode 21 and the second electrode 22, an electric field LEF may be generated between them, and a dielectrophoretic force acts due to the electric field LEF. The dipoles 31 subjected to the dielectrophoretic force may land such that both ends thereof contact the first electrode 21 and the second electrode 22 as illustrated in FIG. 13 while their orientation directions and positions may be changed little by little. As described above, in case that the dielectrophoretic force acts, since the orientation directions of the dipoles 31 may be already generally aligned in a specific direction, movements of the dipoles 31 due to the dielectrophoretic force may also be generally similar. Accordingly, the alignment accuracy of the landed dipoles 31 may increase.

Figure 14:
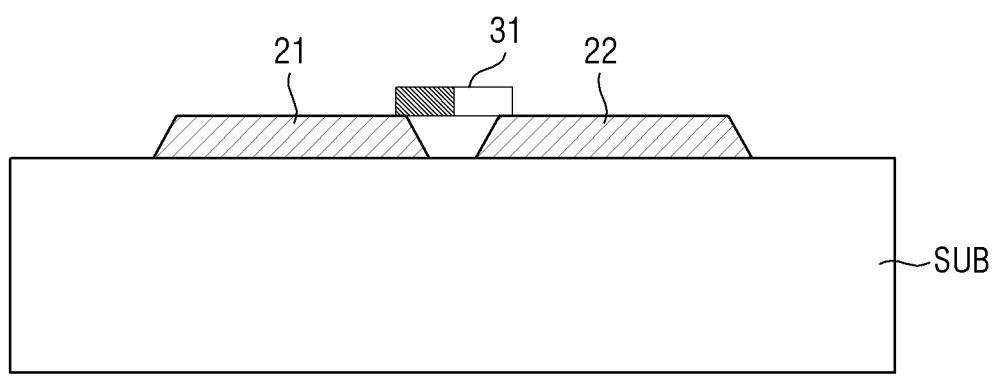

As illustrated in FIG. 14, a solvent 32 of the ink 30 may be removed by volatilization or vaporization. The removal of the solvent 32 may prevent a flow between the dipoles 31 and each electrode and increase the adhesion between them. As a result, the dipoles 31 can be accurately aligned between the first electrode 21 and the second electrode 22.

The inkjet printing apparatus 1000 and the dipole alignment method described above may be used to manufacture a display device including light emitting elements which may be a kind of the dipoles 31. This will now be described in detail.

Figure 15:
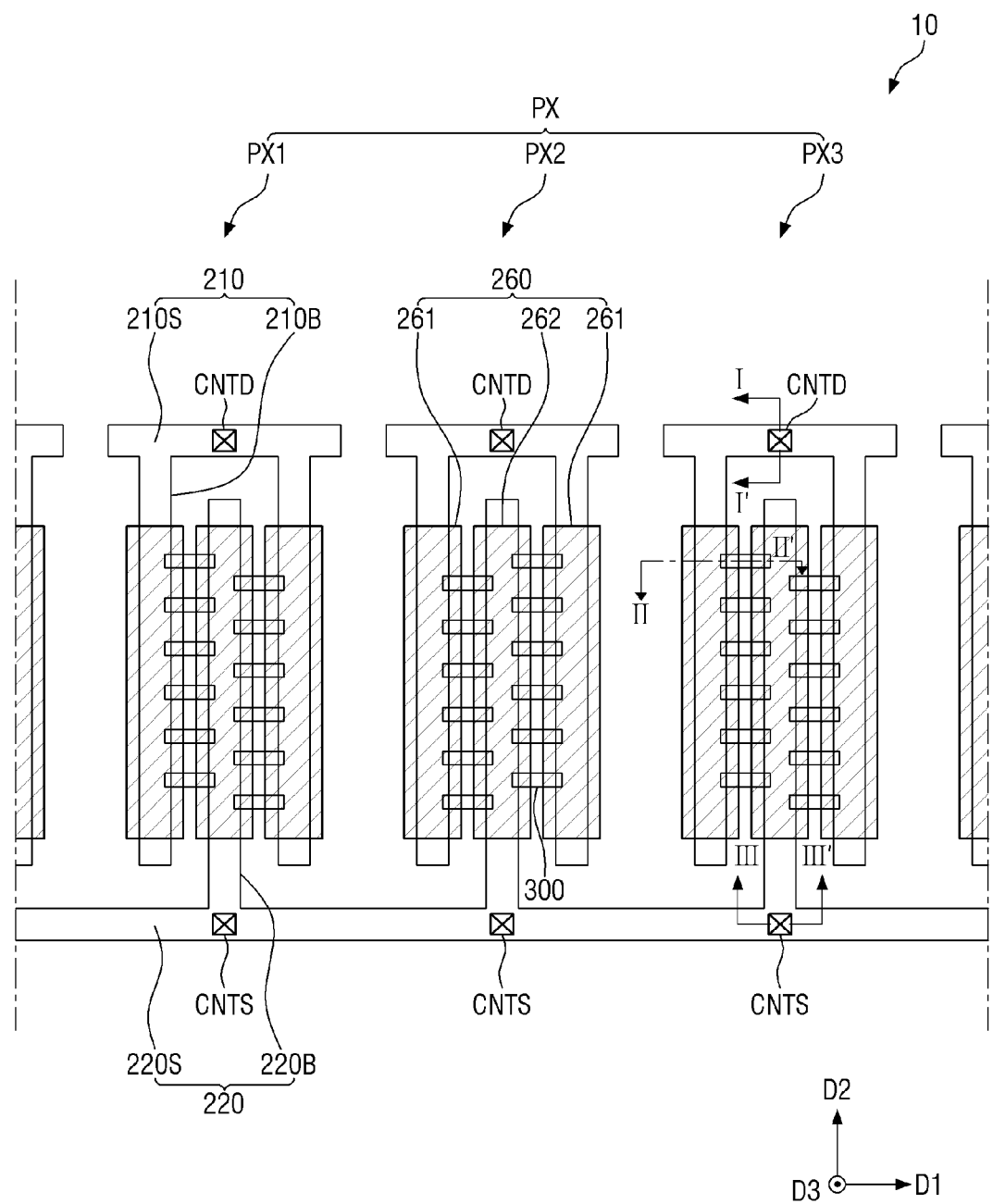
FIG. 15 is a schematic plan view of a display device manufactured using a method according to an embodiment.

FIG. 15 is a schematic plan view of a display device manufactured using a method according to an embodiment.

Referring to FIG. 15, the display device 10 may include pixels PX (PX1 through PX3). The pixels PX may emit light in a specific wavelength band to the outside of the display device 10. The pixels PX may be arranged in a matrix direction. In FIG. 15, three pixels PX1 through PX3 emitting different colors are illustrated as an example. A first pixel PX1 may display red, a second pixel PX2 may display green, and a third pixel PX3 may display blue. The pixels PX may be alternately arranged along rows and columns.

Each pixel PX may include one or more light emitting elements 300. The pixels PX displaying different colors may include light emitting elements 300 emitting different colors. For example, the first pixel PX1 may include light emitting elements 300 emitting red light, the second pixel PX2 may include light emitting elements 300 emitting green light, and the third pixel PX3 may include light emitting elements 300 emitting blue light. However, the disclosure is not limited thereto. In some cases, pixels displaying different colors may include light emitting elements 300 emitting light of the same color (e.g., blue light), and a wavelength conversion layer or a color filter may be placed on an emission path to implement the color of each pixel.

Each light emitting element 300 may include a semiconductor having an end doped with a p type (or an n type) and another end doped with an n type (or a p type) which may be an opposite conductivity type. For example, the light emitting elements 300 may be a kind of dipoles.

The display device 10 may include electrodes 210 and 220. At least a part of each of the electrodes 210 and 220 may be disposed in each pixel PX and electrically connected to the light emitting elements 300 and may transmit an electrical signal so that the light emitting elements 300 emit light of a specific color.

At least a part of each of the electrodes 210 and 220 may be utilized to form an electric field in the pixel PX so as to align the light emitting elements 300. As described above, a dielectrophoresis method may be used to align the light emitting elements 300 which may be a kind of dipoles. Here, AC power may be applied to each of the electrodes 210 and 220 to generate an electric field between a first electrode 210 and a second electrode 220.

The electrodes 210 and 220 may include the first electrode 210 and the second electrode 220. In an embodiment, the first electrode 210 may be a separate pixel electrode disposed in each pixel PX, and the second electrode 220 may be a common electrode commonly connected along multiple pixels PX. Any one of the first electrode 210 and the second electrode 220 may be an anode of each light emitting element 300, and another may be a cathode of each light emitting element 300. However, the disclosure is not limited thereto, and the opposite may also be the case.

Each of the first electrode 210 and the second electrode 220 may include an electrode stem 210S or 220S extending in the first direction D1 and at least one electrode branch 210B or 220B extending and branching from the electrode stem 210S or 220S in the second direction D2 intersecting the first direction D1.

Specifically, the first electrode 210 may include a first electrode stem 210S extending in the first direction D1 and at least one first electrode branch 210B branching from the first electrode stem 210S and extending in the second direction D2. Although not illustrated in the drawing, an end of the first electrode stem 210S may be electrically connected to an electrode pad, and another end may extend in the first direction D1 but may be electrically isolated between the pixels PX. The electrode pad may contact a probe of a probe device described above and thus receive AC power.

The first electrode stem 210S of any one pixel may lie on substantially the same straight line as the first electrode stem 210S of a neighboring pixel (e.g., adjacent in the first direction D1) belonging to the same row. In other words, both ends of the first electrode stem 210S of a pixel may end between pixels PX at a distance from the pixels PX, but the first electrode stem 210S of a neighboring pixel may be aligned on an extension of the first electrode stem 210S of the pixel.

This arrangement of the first electrode stems 210S may be achieved by forming one stem electrode in a manufacturing process and cutting the stem electrode using a laser or the like after the alignment process of the light emitting elements 300 may be performed. Accordingly, the first electrode stems 210S respectively disposed in the pixels PX may transmit different electrical signals to their respective first electrode branches 210B, and the first electrode branches 210B respectively disposed in the pixels PX may be driven separately.

The first electrode branch 210B may branch from at least a part of the first electrode stem 210S and extend in the second direction D2 to end at a position spaced apart from a second electrode stem 220S facing the first electrode stem 210S. For example, the first electrode branch 210B may be disposed in each pixel PX such that an end may be electrically connected to the first electrode stem 210S, and another end may be spaced apart from the second electrode stem 220S. Since the first electrode branch 210B may be electrically connected to the first electrode stem 210S which may be electrically isolated in each pixel PX, a different electrical signal may be transmitted to each pixel PX.

One or more first electrode branches 210B may be disposed in each pixel PX. Although two first electrode branches 210B may be disposed, and a second electrode branch 220B may be disposed between them in FIG. 15, the disclosure is not limited thereto, and a larger number of first electrode branches 210B can be disposed. The first electrode branches 210B may be alternately disposed with second electrode branches 220B while being spaced apart from the second electrode branches 220B, and the light emitting elements 300 may be disposed between them. In some embodiments, the second electrode branch 220B may be disposed between the first electrode branches 210B, so that each pixel PX has a symmetrical structure with respect to the second electrode branch 220B. However, the disclosure is not limited thereto.

The second electrode 220 may include the second electrode stem 220S extending in the first direction D1 and spaced apart from the first electrode stem 210S to face the first electrode stem 210S and at least one second electrode branch 220B branching from the second electrode stem 220S, extending in the second direction D2 and spaced apart from the first electrode branches 210B to face the first electrode branches 210B. Like the first electrode stem 210S, the second electrode stem 220S may have an end connected to an electrode pad. Another end of the second electrode stem 220S may extend to pixels PX adjacent in the first direction D1. For example, the second electrode stem 220S may be electrically connected between the pixels PX. Accordingly, both ends of the second electrode stem 220S of any pixel may be connected to respective ends of the second electrode stems 220S of neighboring pixels between the pixels PX. Thus, the same electrical signal may be transmitted to each pixel PX.

The second electrode branch 220B may branch from at least a part of the second electrode stem 220S and extend in the second direction D2 to end at a position spaced apart from the first electrode stem 210S. For example, the second electrode branch 220B may be disposed in each pixel PX such that an end may be connected to the second electrode stem 220S, and another end may be spaced apart from the first electrode stem 210S. Since the second electrode branch 220B may be connected to the second electrode stem 220S that may be electrically connected to each pixel PX, the same electrical signal may be transmitted to each pixel PX.

The second electrode branch 220B may be spaced apart from the first electrode branches 210B to face the first electrode branches 210B. Here, since the first electrode stem 210S and the second electrode stem 220S may be spaced apart to face each other in opposite directions with respect to the center of each pixel PX, the first electrode branches 210B and the second electrode branch 220B may extend in opposite directions. In other words, the first electrode branches 210B may extend in a direction of the second direction D2, and the second electrode branch 220B may extend in another direction of the second direction D2. Thus, respective ends of the branches may be disposed in opposite directions with respect to the center of each pixel PX. However, the disclosure is not limited thereto, and the first electrode stem 210S and the second electrode stem 220S may also be disposed in the same direction with respect to the center of each pixel PX and spaced apart from each other. The first electrode branches 210B and the second electrode branch 220B respectively branching from the first and second electrode stems 210S and 220S may extend in the same direction.

Although one second electrode branch 220B may be disposed in each pixel PX in FIG. 15, the disclosure is not limited thereto, and a larger number of second electrode branches 220B can be disposed.

The light emitting elements 300 may be aligned between the first electrode branches 210B and the second electrode branch 220B. Specifically, at least some of the light emitting elements 300 may have ends electrically connected to the first electrode branches 210B and other ends electrically connected to the second electrode branch 220B. The light emitting elements 300 may be aligned by the above-described dipole alignment method and may have excellent alignment accuracy.

The light emitting elements 300 may be spaced apart from each other in the second direction D2 and aligned substantially parallel to each other. A gap between the light emitting elements 300 is not particularly limited. In some cases, light emitting elements 300 may be disposed adjacent to each other to form a group, and other light emitting elements 300 may form a group while being spaced apart from each other by a distance. In other embodiments, the light emitting elements 300 may have non-uniform density but may be oriented and aligned in one direction.

Contact electrodes 260 may be disposed on the first and second electrode branches 210B and 220B, respectively. The contact electrodes 260 may extend in the second direction D2 and may be spaced apart from each other in the first direction D1. The contact electrodes 260 may include first contact electrodes 261 which may be disposed on the first electrode branches 210B and contact ends of the light emitting elements 300 and a second contact electrode 262 which may be disposed on the second electrode branch 220B and contact other ends of the light emitting elements 300.

The first electrode stem 210S and the second electrode stem 220S may be electrically connected to a thin-film transistor 120 or a power wiring 161, which will be described later, through a first contact hole CNTD and a second contact hole CNTS. Although the contact holes on the first electrode stem 210S and the second electrode stem 220S may be disposed in each pixel PX in FIG. 15, the disclosure is not limited thereto. As described above, since the second electrode stem 220S may extend to adjacent pixels PX and be electrically connected to the adjacent pixels PX, the second electrode stem 220S may be electrically connected to thin-film transistors through one contact hole in some embodiments.

Figure 16:
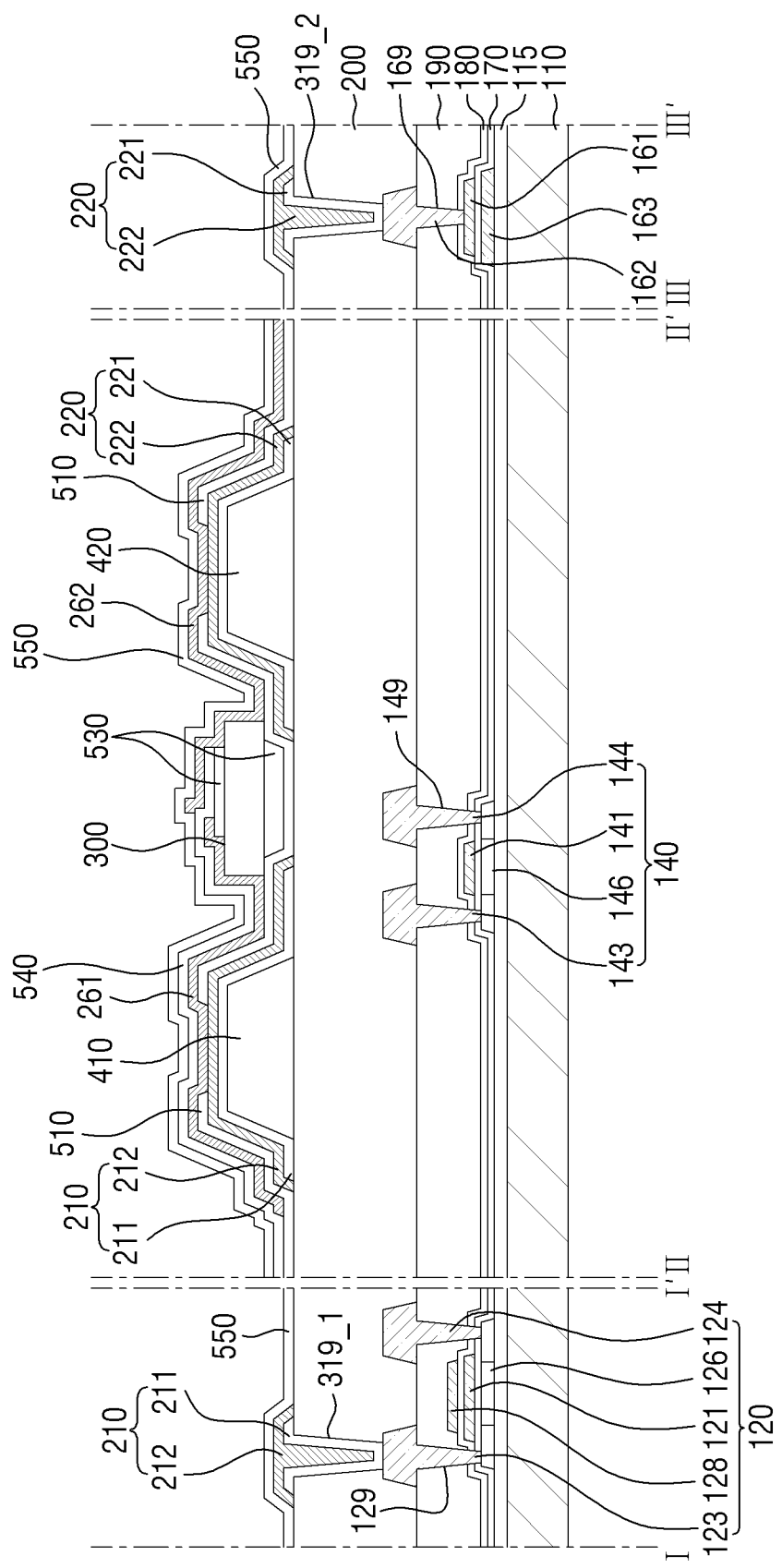
FIG. 16 is a schematic cross-sectional view taken along lines I-I', II-II', and III-III' of FIG. 15.

FIG. 16 is a schematic cross-sectional view taken along lines I-I', II-II', and III-III' of FIG. 15.

Referring to FIGS. 15 and 16, the display device 10 may include a substrate 110, one or more thin-film transistors 120 and 140 disposed on the substrate 110, and the electrodes 210 and 220 and the light emitting element 300 disposed above the thin-film transistors 120 and 140. The thin-film transistors may include a first thin-film transistor 120 which may be a driving transistor transmitting a driving signal. The thin-film transistors may further include a second thin-film transistor 140. The second thin-film transistor 140 may be, but is not limited to, a switching transistor which transmits a data signal. Each of the thin-film transistors 120 and 140 may include an active layer, a gate electrode, a source electrode, and a drain electrode. The first electrode 210 may be electrically connected to the drain electrode of the first thin-film transistor 120.

More specifically, as for the cross-sectional structure of the display device 10, the substrate 110 may be an insulating substrate. The substrate 110 may be made of an insulating material such as glass, quartz, polymer resin, or a combination thereof. Examples of the polymer material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate or may be a flexible substrate that can be bent, folded, rolled, etc.

A buffer layer 115 may be disposed on the substrate 110. The buffer layer 115 may prevent diffusion of impurity ions, prevent permeation of moisture or outside air, and perform a surface planarization function. The buffer layer 115 may include silicon nitride, silicon oxide, silicon oxynitride, or a combination thereof.

A semiconductor layer may be disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, an oxide semiconductor, or a combination thereof.

A first gate insulating layer 170 may be disposed on the semiconductor layer. The first gate insulating layer 170 may cover the semiconductor layer. The first gate insulating layer 170 may function as gate insulating films of thin-film transistors. The first gate insulating layer 170 may include silicon oxide, silicon nitride, silicon oxynitride, aluminum oxide, tantalum oxide, hafnium oxide, zirconium oxide, titanium oxide, etc. These materials may be used alone or in combination with each other.

A first conductive layer may be disposed on the first gate insulating layer 170. The first conductive layer may include a first gate electrode 121 disposed on the first active layer 126 of the first thin-film transistor 120 with the first gate insulating layer 170 interposed between them, a second gate electrode 141 disposed on the second active layer 146 of the second thin-film transistor 140, and the power wiring 161 disposed on the auxiliary layer 163. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single film or a multilayer film.

A second gate insulating layer 180 may be disposed on the first conductive layer. The second gate insulating layer 180 may be an interlayer insulating film. The second gate insulating layer 180 may be made of an inorganic insulating material such as silicon oxide, silicon nitride, silicon oxynitride, hafnium oxide, aluminum oxide, titanium oxide, tantalum oxide, zinc oxide, or a combination thereof.

A second conductive layer may be disposed on the second gate insulating layer 180. The second conductive layer may include a capacitor electrode 128 disposed on the first gate electrode 121 with the second gate insulating layer interposed between them. The capacitor electrode 128 may form a storage capacitor with the first gate electrode 121.

Like the first conductive layer, the second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 may be disposed on the second conductive layer. The interlayer insulating layer 190 may be an interlayer insulating film. Further, the interlayer insulating layer 190 may perform a surface planarization function. The interlayer insulating layer 190 may include an organic insulating material such as polyacrylates resin, epoxy resin, phenolic resin, polyamides resin, polyimides resin, unsaturated polyesters resin, polyphenylenethers resin, polyphenylenesulfides resin, benzocyclobutene (BCB), or a combination thereof.

A third conductive layer may be disposed on the interlayer insulating layer 190. The third conductive layer may include a first drain electrode 123 and a first source electrode 124 of the first thin-film transistor 120, a second drain electrode 143 and a second source electrode 144 of the second thin-film transistor 140, and a power electrode 162 disposed on the power wiring 161.

The first source electrode 124 and the first drain electrode 123 may be electrically connected to the first active layer 126 respectively through first contact holes 129 penetrating the interlayer insulating layer 190 and the second gate insulating layer 180. The second source electrode 144 and the second drain electrode 143 may be electrically connected to the second active layer 146 respectively through second contact holes 149 penetrating the interlayer insulating layer 190 and the second gate insulating layer 180. The power electrode 162 may be electrically connected to the power wiring 161 through a third contact hole 169 penetrating the interlayer insulating layer 190 and the second gate insulating layer 180.

The third conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single film or a multilayer film. For example, the third conductive layer may have a stacked structure of Ti/Al/Ti, Mo/Al/Mo, Mo/AlGe/Mo, or Ti/Cu.

A via layer 200 may be disposed on the third conductive layer. The via layer 200 may be made of an organic material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The surface of the via layer 200 may be flat. The via layer 200 may serve as a base layer on which the first electrode 210, the second electrode 220, and the light emitting element 300 may be disposed.

Banks 410 and 420 may be disposed on the via layer 200. The banks 410 and 420 may be spaced apart to face each other in each pixel PX, and the first and second electrodes 210 and 220 may be disposed on the banks 410 and 420 spaced apart from each other, for example, on first and second banks 410 and 420, respectively.

The banks 410 and 420 may be formed of substantially the same material in a process. The banks 410 and 420 may form one lattice pattern. The banks 410 and 420 may include polyimide (PI).

The banks 410 and 420 may protrude from the via layer 200 in a thickness direction. Each of the banks 410 and 420 may protrude upward from a plane in which the light emitting element 300 may be disposed, and at least a portion of the protruding part may have a slope.

Reflective layers 211 and 221 may be disposed on the sloping and protruding banks 410 and 420 to reflect light. The reflective layers may include a first reflective layer 211 and a second reflective layer 221.

The first reflective layer 211 may cover the first bank 410, and a part of the first reflective layer 211 may be electrically connected to the first drain electrode 123 of the first thin-film transistor 120 through a fourth contact hole 319_1 penetrating the via layer 200. The second reflective layer 221 may cover the second bank 420, and a part of the second reflective layer 221 may be electrically connected to the power electrode 162 through a fifth contact hole 319_2 penetrating the via layer 200.

The reflective layers 211 and 221 may include a material having high reflectivity in order to reflect light emitted from the light emitting element 300. For example, the reflective layers 211 and 221 may include, but are not limited to, a material such as silver (Ag), copper (Cu), or a combination thereof.

A first electrode layer 212 and a second electrode layer 222 may be disposed on the first reflective layer 211 and the second reflective layer 221, respectively.

The first electrode layer 212 may be disposed on (e.g., directly on) the first reflective layer 211. The first electrode layer 212 may have substantially the same pattern as the first reflective layer 211. The second electrode layer 222 may be disposed on (e.g., directly on) the second reflective layer 221 and spaced apart from the first electrode layer 212. The second electrode layer 222 may have substantially the same pattern as the second reflective layer 221.

In an embodiment, the electrode layers 212 and 222 may cover the reflective layers 211 and 221 disposed thereunder, respectively. For example, the electrode layers 212 and 222 may be formed to be larger than the reflective layers 211 and 221 to cover side surfaces of ends of the reflective layers 211 and 221. However, the disclosure is not limited thereto.

The first electrode layer 212 and the second electrode layer 222 may respectively transmit electrical signals, which may be transmitted to the first reflective layer 211 and the second reflective layer 221 connected to the first thin-film transistor 120 or the power electrode 162, to the contact electrodes 261 and 262 which will be described later. The electrode layers 212 and 222 may include a transparent conductive material. For example, the electrode layers 212 and 222 may include, but are not limited to, a material such as indium tin oxide (ITO), indium zinc oxide (IZO), indium tin-zinc oxide (ITZO), or a combination thereof. In some embodiments, the reflective layers 211 and 221 and the electrode layers 212 and 222 may form a structure in which one or more transparent conductive layers such as ITO, IZO or ITZO and one or more metal layers such as silver or copper may be stacked. For example, the reflective layers 211 and 221 and the electrode layers 212 and 222 may form a stacked structure of ITO/silver(Ag)/ITO.

The first reflective layer 211 and the first electrode layer 212 disposed on the first bank 410 may constitute the first electrode 210. The first electrode 210 may protrude from both ends of the first bank 410. Accordingly, the protruding areas of the first electrode 210 may contact the via layer 200. The second reflective layer 221 and the second electrode layer 222 disposed on the second bank 420 may constitute the second electrode 220. The second electrode 220 may protrude from both ends of the second bank 420. Accordingly, the protruding areas of the second electrode 220 may contact the via layer 200. Deceased The first electrode 210 and the second electrode 220 may cover the entire area of the first bank 410 and the entire area of the second bank 420, respectively. However, as described above, the first electrode 210 and the second electrode 220 may be spaced apart to face each other. A first insulating layer 510 may be disposed between the electrodes as will be described later, and a second insulating layer 520 and the light emitting element 300 may be disposed on the first insulating layer 510.

The first reflective layer 211 may receive a driving voltage from the first thin-film transistor 120, and the second reflective layer 221 may receive a power supply voltage from the power wiring 161. Therefore, the first electrode 210 and the second electrode 220 may receive the driving voltage and the power supply voltage, respectively.

Specifically, the first electrode 210 may be electrically connected to the first thin-film transistor 120, and the second electrode 220 may be electrically connected to the power wiring 161. Accordingly, the first contact electrode 261 and the second contact electrode 262 disposed on the first electrode 210 and the second electrode 220 may receive the driving voltage and the power supply voltage. The driving voltage and the power supply voltage may be transmitted to the light emitting element 300, and a current may flow through the light emitting element 300, causing the light emitting element 300 to emit light.

The first insulating layer 510 may be disposed on the first electrode 210 and the second electrode 220 to partially cover them. The first insulating layer 510 may cover most of upper surfaces of the first electrode 210 and the second electrode 220 but may partially expose the first electrode 210 and the second electrode 220. The first insulating layer 510 may be disposed in a space between the first electrode 210 and the second electrode 220. In FIG. 15, the first insulating layer 510 may be disposed along a space between the first and second electrode branches 210B and 220B to have an island shape or a linear shape in plan view.

In FIG. 16, the first insulating layer 510 may be disposed in the space between one first electrode 210 (e.g., the first electrode branch 210B) and one second electrode 220 (e.g., the second electrode branch 220B). However, as described above, since the first electrode 210 and the second electrode 220 may also be provided in plural numbers, the first insulating layer 510 may also be disposed between one first electrode 210 and another second electrode 220 or between one second electrode 220 and another first electrode 210.

The first insulating layer 510 may overlap some areas of the electrodes 210 and 220, for example, may partially overlap areas of the first and second electrodes 210 and 220 which protrude in directions facing each other. The first insulating layer 510 may also be disposed in areas where inclined side surfaces and flat upper surfaces of the banks 410 and 420 may be overlapped by the electrodes 210 and 220. The first insulating layer 510 may be disposed on opposite sides of the first and second electrodes 210 and 220 from the facing sides of the first and second electrodes 210 and 220 to partially cover them. For example, the first insulating layer 510 may be disposed to expose only central parts of the first and second electrodes 210 and 220.

The first insulating layer 510 may be disposed between the light emitting element 300 and the via layer 200. A lower surface of the first insulating layer 510 may contact the via layer 200, and the light emitting element 300 may be disposed on an upper surface of the first insulating layer 510. The first insulating layer 510 may contact the electrodes 210 and 220 on both sides to electrically insulate them from each other.

For example, the first insulating layer 510 may cover respective ends of the first and second electrodes 210 and 220 which protrude in the directions facing each other. A part of the lower surface of the first insulating layer 510 may contact the via layer 200, and a part of the lower surface and a side surface of the first insulating layer 510 may contact each electrode 210 or 220. Accordingly, the first insulating layer 510 may protect areas overlapping the electrodes 210 and 220 while electrically insulating them from each other. It may prevent a first conductivity type semiconductor 310 and a second conductivity type semiconductor 320 of the light emitting element 300 from contacting (e.g., directly contacting) other members, thereby preventing damage to the light emitting element 300.

However, the disclosure is not limited thereto. In some embodiments, the first insulating layer 510 may be disposed only on areas of the first and second electrodes 210 and 220 which overlap the inclined side surfaces of the banks 410 and 420. The lower surface of the first insulating layer 510 may end on the inclined side surfaces of the banks 410 and 420, and the electrodes 210 and 220 disposed on part of the inclined side surfaces of the banks 410 and 420 may be exposed to contact the contact electrodes 260.

The first insulating layer 510 may be disposed to expose both ends of the light emitting element 300. Accordingly, the contact electrodes 260 may contact the exposed upper surfaces of the electrodes 210 and 220 and both ends of the light emitting element 300 and may transmit electrical signals transmitted to the first and second electrodes 210 and 220 to the light emitting element 300.

The light emitting element 300 may have an end electrically connected to the first electrode 210 and another end electrically connected to the second electrode 220. Both ends of the light emitting element 300 may contact the first contact electrode 261 and the second contact electrode 262, respectively.

The light emitting element 300 may be a light emitting diode (LED). The light emitting element 300 may be a nanostructure generally having a size of nanometers. The light emitting element 300 may be an inorganic LED made of an inorganic material. In case that the light emitting element 300 is an inorganic LED, if a light emitting material having an inorganic crystal structure is placed between two opposing electrodes and an electric field may be formed in a specific direction in the light emitting material, the inorganic LED may be aligned between the two electrodes in which specific polarities may be formed.

In some embodiments, the light emitting element 300 may have a structure in which the first conductivity type semiconductor 310 (see FIG. 17), an element active layer 330, the second conductivity type semiconductor 320, and an electrode material layer 370 may be stacked. In the light emitting element 300, the first conductivity type semiconductor 310, the element active layer 330, the second conductivity type semiconductor 320, and the electrode material layer 370 may be stacked in this order in a direction parallel to the via layer 200. In other words, the light emitting element 300 in which the above layers may be stacked may be disposed in the horizontal direction parallel to the via layer 200. However, the disclosure is not limited thereto, and the light emitting element 300 may also be aligned between the first and second electrodes 210 and 220 such that its stacking direction may be opposite to the above stacking direction. The structure of the light emitting element 300 will be described in detail later.

The second insulating layer 530 may be disposed on the light emitting element 300 to overlap at least a part of the light emitting element 300. The second insulating layer 530 may protect the light emitting element 300 and fix the light emitting element 300 between the first electrode 210 and the second electrode 220.

Although the second insulating layer 530 may be disposed on an upper surface of the light emitting element 300 in cross section in FIG. 16, it may also be disposed to cover an outer surface of the light emitting element 300. For example, like the first insulating layer 510, the second insulating layer 530 may extend in the second direction D2 along the space between the first and second electrode branches 210B and 220B to have an island shape or a linear shape in plan view.

A part of the material of the second insulating layer 530 may be disposed in an area where a lower surface of the light emitting element 300 contacts the first insulating layer 510. This may be formed in case that the light emitting element 300 may be aligned on the first insulating layer 510 and the second insulating layer 530 may be disposed on the light emitting element 300 during the manufacture of the display device 10. This may result from the permeation of a part of the material of the second insulating layer 530 into an air gap, which may be formed in the first insulating layer 510 in contact with the lower surface of the light emitting element 300, in case that the second insulating layer 530 may be formed.

The second insulating layer 530 may be disposed to expose both side surfaces of the light emitting element 300. The second insulating layer 530 may be recessed inward from both side surfaces of the light emitting element 300. Accordingly, the side surfaces of the first insulating layer 510, the light emitting element 300 and the second insulating layer 530 may be stacked in a staircase pattern. The contact electrodes 261 and 262 to be described later may smoothly contact the side surfaces of both ends of the light emitting element 300. However, the disclosure is not limited thereto, and a length of the second insulating layer 530 may also be equal to a length of the light emitting element 300 so that both sides of the second insulating layer 530 and the light emitting element 300 may be aligned with each other.

The second insulating layer 530 may be disposed to cover the first insulating layer 510 and may be patterned in some areas, for example, in areas where the light emitting element 300 may be exposed to contact the contact electrodes 260.

The patterning of the second insulating layer 530 may be performed through conventional dry etching or wet etching. Here, to prevent the first insulating layer 510 from being patterned, the first insulating layer 510 and the second insulating layer 530 may include materials having different etch selectivities. In other words, in case that the second insulating layer 530 is patterned, the first insulating layer 510 may function as an etching stopper.

Accordingly, even if the second insulating layer 530 may be patterned to cover the outer surface of the light emitting element 300 and expose both ends of the light emitting element 300, the material of the first insulating layer 510 may not be damaged. In particular, the first insulating layer 510 and the light emitting element 300 may form a smooth contact surface at both ends of the light emitting element 300 where the light emitting element 300 contacts the contact electrodes 260.

The first contact electrode 261 and the second contact electrode 262 may be disposed on the upper surfaces of the first electrode 210 and the second electrode 220, respectively. Specifically, the first contact electrode 261 and the second contact electrode 262 may respectively contact the first electrode layer 212 and the second electrode layer 222 in areas where the first insulating layer 510 may be patterned to partially expose the first electrode 210 and the second electrode 220. Each of the first contact electrode 261 and the second contact electrode 262 may contact a side surface of an end of the light emitting element 300, for example, the first conductivity type semiconductor 310, the second conductivity type semiconductor 320, or the electrode material layer 370. Accordingly, the first contact electrode 261 and the second contact electrode 262 may transmit electrical signals transmitted to the first electrode layer 212 and the second electrode layer 222 to the light emitting element 300.

The first contact electrode 261 may be disposed on the first electrode 210 to partially cover the first electrode 210, and a lower surface of the first contact electrode 261 may partially contact the light emitting element 300, the first insulating layer 510 and the second insulating layer 530. An end of the first contact electrode 261 in a direction in which the second contact electrode 262 is disposed may be disposed on the second insulating layer 530. The second contact electrode 262 may be disposed on the second electrode 220 to partially cover the second electrode 220, and a lower surface of the second contact electrode 262 may partially contact the light emitting element 300, the first insulating layer 510 and a third insulating layer 540. An end of the second contact electrode 262 in a direction in which the first contact electrode 261 is disposed may be disposed on the third insulating layer 540.

The first insulating layer 510 and the second insulating layer 530 may be patterned in areas disposed to cover the first electrode 210 and the second electrode 220 on the upper surfaces of the first bank 410 and the second bank 420. Accordingly, the first electrode layer 212 and the second electrode layer 222 of the first electrode 210 and the second electrode 220 may be exposed and may be electrically connected to the contact electrodes 261 and 262 in the exposed areas, respectively.

The first contact electrode 261 and the second contact electrode 262 may be spaced apart from each other on the second insulating layer 530 or the third insulating layer 540. For example, the first contact electrode 261 and the second contact electrode 262 may contact the light emitting element 300 and the second insulating layer 530 or the third insulating layer 540 but may be spaced apart from each other in the stacked direction on the second insulating layer 530 and thus be electrically insulated from each other.

The contact electrodes 261 and 262 may include a conductive material such as, but not limited to, ITO, IZO, ITZO, aluminum (Al), or a combination thereof.

The contact electrodes 261 and 262 may include the same material as the electrode layers 212 and 222. The contact electrodes 261 and 262 may be disposed on the electrode layers 212 and 222 in substantially the same pattern as the electrode layers 212 and 222 so as to contact the electrode layers 212 and 222.

The third insulating layer 540 may be disposed on the first contact electrode 261 to electrically insulate the first contact electrode 261 and the second contact electrode 262 from each other. The third insulating layer 540 may cover the first contact electrode 261 but may not overlap a part of the light emitting element 300 so that the light emitting element 300 can contact the second contact electrode 262. On an upper surface of the second insulating layer 530, the third insulating layer 540 may partially contact the first contact electrode 261, the second contact electrode 262, and the second insulating layer 530. The third insulating layer 540 may cover an end of the first contact electrode 261 on the upper surface of the second insulating layer 530. Accordingly, the third insulating layer 540 may protect the first contact electrode 361 while electrically insulating the first contact electrode 261 from the second contact electrode 262.

An end of the third insulating layer 540 in a direction in which the second electrode 220 is disposed may be aligned with a side surface of the second insulating layer 530.

In some embodiments, the third insulating layer 540 may be omitted from the display device 10. Accordingly, the first contact electrode 261 and the second contact electrode 262 may be disposed on substantially the same plane and may be electrically insulated from each other by a passivation layer 550 which will be described later.

The passivation layer 550 may be formed on the third insulating layer 540 and the second contact electrode 262 to protect the members disposed on the via layer 200 from the external environment. If the first contact electrode 261 and the second contact electrode 262 may be exposed, the contact electrode material may be broken due to electrode damage. Therefore, they may be covered with the passivation layer 550. For example, the passivation layer 550 may cover the first electrode 210, the second electrode 220, the light emitting element 300, etc. As described above, if the third insulating layer 540 is omitted, the passivation layer 550 may be formed on the first contact electrode 261 and the second contact electrode 262. The passivation layer 550 may electrically insulate the first contact electrode 261 and the second contact electrode 262 from each other.

Each of the first insulating layer 510, the second insulating layer 530, the third insulating layer 540, and the passivation layer 550 described above may include an inorganic insulating material. For example, the first insulating layer 510, the second insulating layer 530, the third insulating layer 540, and the passivation layer 550 may include a material such as silicon oxide ($SiO_x$), silicon nitride ($SiN_x$), silicon oxynitride ($SiO_xN_y$), aluminum oxide (Al2O3), aluminum nitride (AlN), or a combination thereof. The first insulating layer 510, the second insulating layer 530, the third insulating layer 540 and the passivation layer 550 may be made of the same material but may also be made of different materials. Also, various materials that give an insulating property to the first insulating layer 510, the second insulating layer 530, the third insulating layer 540 and the passivation layer 550 are applicable.

The first insulating layer 510 and the second insulating layer 530 may have different etch selectivities as described above. For example, in case that the first insulating layer 510 includes silicon oxide ($SiO_x$), the second insulating layer 530 may include silicon nitride ($SiN_x$). As another example, in case that the first insulating layer 510 includes silicon nitride ($SiN_x$), the second insulating layer 530 may include silicon oxide ($SiO_x$). However, the disclosure is not limited thereto.

The light emitting element 300 may be manufactured on a substrate by an epitaxial growth method. A seed crystal layer for forming a semiconductor layer may be formed on the substrate, and a desired semiconductor material may be deposited and grown. The structure of light emitting element 300 according to various embodiments will now be described in detail with reference to FIG. 17.

Figure 17:
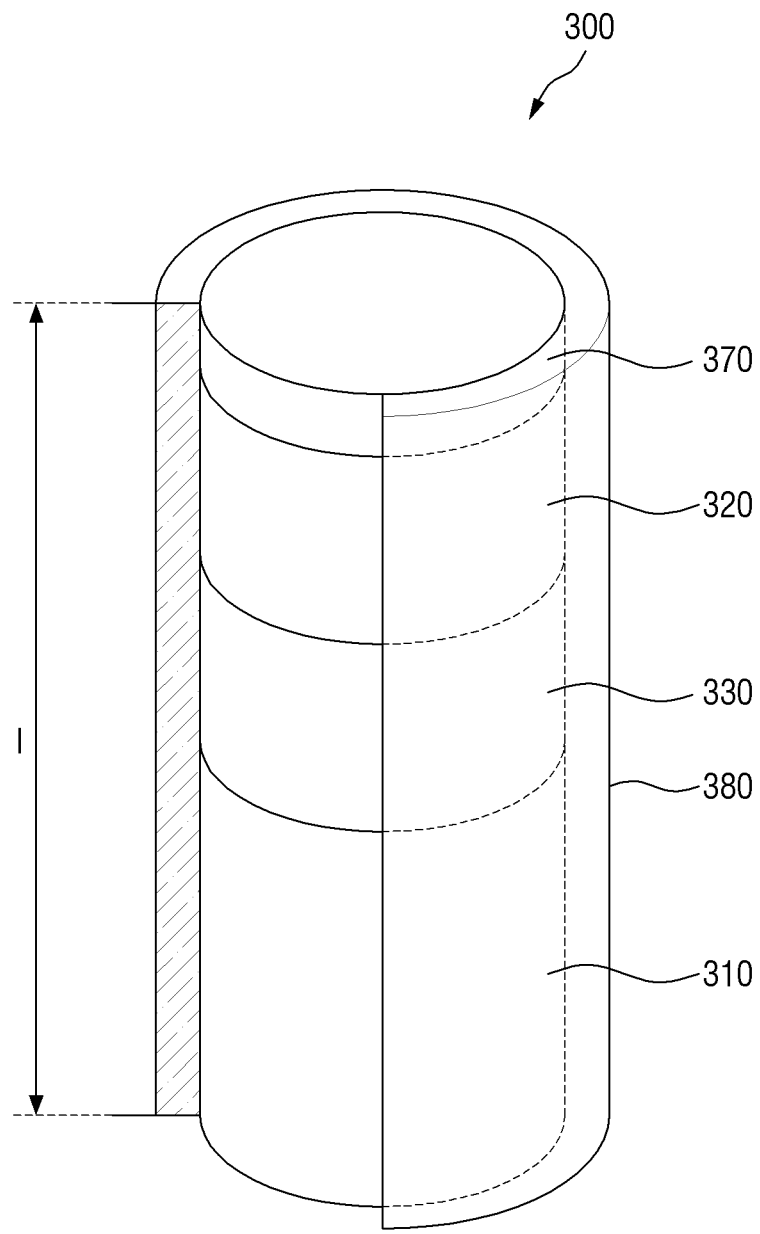
FIG. 17 is a schematic view of a light emitting element according to an embodiment.

FIG. 17 is a schematic view of a light emitting element according to an embodiment. Referring to FIG. 17, the light emitting element 300 may include multiple conductivity type semiconductors 310 and 320, the element active layer 330, the electrode material layer 370, and an insulating material film 380. Electrical signals transmitted from the first electrode 210 and the second electrode 220 may be transmitted to the element active layer 330 through the conductivity type semiconductors 310 and 320. As a result, light may be emitted.

Specifically, the light emitting element 300 may include a rod-shaped semiconductor core which may include the first conductivity type semiconductor 310, the second conductivity type semiconductor 320, the element active layer 330 disposed between the first conductivity type semiconductor 310 and the second conductivity type semiconductor 320 and the electrode material layer 370 disposed on the second conductivity type semiconductor 320 and the insulating material film 380 which surrounds an outer circumferential surface of the semiconductor core. The light emitting element 300 of FIG. 17 has a structure in which the first conductivity type semiconductor 310, the element active layer 330, the second conductivity type semiconductor 320 and the electrode material layer 370 of the semiconductor core may be sequentially stacked in a longitudinal direction. However, the disclosure is not limited thereto. The electrode material layer 370 can be omitted and, in some embodiments, may be disposed on at least any one of both side surfaces of the first conductivity type semiconductor 310 and the second conductivity type semiconductor 320. The light emitting element 300 of FIG. 4 will hereinafter be described as an example, and the following description of the light emitting element 300 can be applied the same even if the light emitting element 300 further includes another structure.

The first conductivity type semiconductor 310 may be an n-type semiconductor layer. In an example, in case that the light emitting element 300 emits light in a blue wavelength band, the first conductivity type semiconductor 310 may be a semiconductor material having a chemical formula of $In_xAl_yGa_{1-x-y}N$ ($0 \leq x \leq 1$, $0 \leq y \leq 1$, $0 \leq x+y \leq 1$), for example, may be any one or more of n-type doped InAlGaN, GaN, AlGaN, InGaN, AlN and InN. The first conductivity type semiconductor 310 may be doped with a first conductive dopant, and the first conductive dopant may be, for example, Si, Ge, or Sn. A length of the first conductivity type semiconductor 310 may be in the range of, but not limited to, about 1.5 μm to about 5 μm.

The second conductivity type semiconductor 320 may be a p-type semiconductor layer. In an example, in case that the light emitting element 300 emits light in the blue wavelength band, the second conductivity type semiconductor 320 may be a semiconductor material having a chemical formula of $In_xAl_yGa_{1-x-y}N$ ($0 \leq x \leq 1$, $0 \leq y \leq 1$, $0 \leq x+y \leq 1$), for example, may be any one or more of p-type doped InAlGaN, GaN, AlGaN, InGaN, AlN and InN. The second conductivity type semiconductor 320 may be doped with a second conductive dopant, and the second conductive dopant may be, for example, Mg, Zn, Ca, Se or Ba. A length of the second conductivity type semiconductor 320 may be in the range of, but not limited to, about 0.08 μm to about 0.25 μm.

The element active layer 330 may be disposed between the first conductivity type semiconductor 310 and the second conductivity type semiconductor 320 and may include a material having a single or multiple quantum well structure. In case that the element active layer 330 includes a material having a multiple quantum well structure, it may have a structure in which multiple quantum layers and multiple well layers may be alternately stacked. The element active layer 330 may emit light through combination of electron-hole pairs according to electrical signals received through the first conductivity type semiconductor 310 and the second conductivity type semiconductor 320. For example, in case that the element active layer 330 emits light in the blue wavelength band, it may include a material such as AlGaN, AlInGaN, or a combination thereof. In particular, in case that the element active layer 330 has a multiple quantum well structure in which a quantum layer and a well layer may be alternately stacked, the quantum layer may include a material such as AlGaN or AlInGaN, and the well layer may include a material such as GaN or AlGaN. However, the disclosure is not limited thereto, and the element active layer 330 may also have a structure in which a semiconductor material having a large band gap energy and a semiconductor material having a small band gap energy may be alternately stacked or may include different group 3 or 5 semiconductor materials depending on the wavelength band of emitted light. Accordingly, light emitted from the element active layer 330 is not limited to light in the blue wavelength band, but may also be light in red and green wavelength bands in some cases. A length of the element active layer 330 may be in the range of, but not limited to, 0.05 to 0.25 μm.

Light emitted from the element active layer 330 may be radiated not only to an outer surface of the light emitting element 300 in the longitudinal direction but also to both side surfaces. For example, the direction of the light emitted from the element active layer 330 is not limited to one direction.

The electrode material layer 370 may be an ohmic contact electrode. However, the disclosure is not limited thereto, and the electrode material layer 370 may also be a Schottky contact electrode. The electrode material layer 370 may include a conductive metal. For example, the electrode material layer 370 may include at least any one or more of aluminum (Al), titanium (Ti), indium (In), gold (Au), and silver (Ag). The electrode material layer 370 may include the same material or different materials, but the disclosure is not limited thereto.

The insulating material film 380 may surround the outer circumferential surface of the semiconductor core. Specifically, the insulating material film 380 may be formed outside the first conductivity type semiconductor 310, the second conductivity type semiconductor 320, the element active layer 330 and the electrode material layer 370 and may protect these members. For example, the insulating material film 380 may be formed to surround sides of the above members and may not be formed at both ends of the light emitting element 300 in the longitudinal direction, for example, at both ends where the first conductivity type semiconductor 310 and the electrode material layer 370 may be disposed. However, the disclosure is not limited thereto.

In the drawing, the insulating material film 380 extends in the longitudinal direction to cover from the first conductivity type semiconductor 310 to the electrode material layer 370. However, the disclosure is not limited thereto, and the insulating material film 380 may also cover only the first conductivity type semiconductor 310, the element active layer 330 and the second conductivity type semiconductor 320 or may cover only a part of an outer surface of the electrode material layer 370 to expose a part of the outer surface of the electrode material layer 370.

A thickness of the insulating material film 380 may be in the range of, but not limited to, about 0.5 μm to about 1.5 μm.

The insulating material film 380 may include an insulating film and an element coupler coupled to the insulating film. The insulating film may have insulating properties and protect the first conductivity type semiconductor 310, the second conductivity type semiconductor 320, the element active layer 330, and the electrode material layer 370.

The insulating film may include an insulating material such as silicon oxide ($SiO_x$), silicon nitride ($SiN_x$), silicon oxynitride ($SiO_xN_y$), aluminum nitride (AlN), aluminum oxide (Al2O3), or a combination thereof. Accordingly, it may be possible to prevent an electrical short circuit that may occur in case that the element active layer 330 contacts (e.g., directly contacts) the first electrode 210 or the second electrode 220. Since the insulating film 381 may protect an outer circumferential surface of the light emitting element 300 including the element active layer 330, a reduction in luminous efficiency can be prevented.

An outer circumferential surface of the insulating film may be surface-treated, and the element coupler may be coupled to at least a part of the surface. The element coupler may form a covalent bond with the second insulating layer 520 and fix the light emitting element 300 between the electrodes 210 and 220 during the manufacture of the display device 10.

A method of manufacturing a display device such as one described above will now be described.

Figure 18:
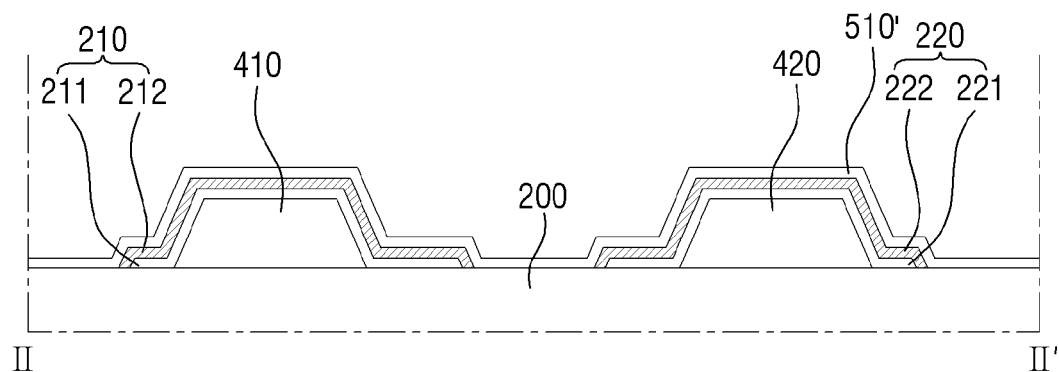
FIGS. 18 and 19 are schematic cross-sectional views respectively illustrating operations in a display device manufacturing method according to an embodiment.
Figure 19:
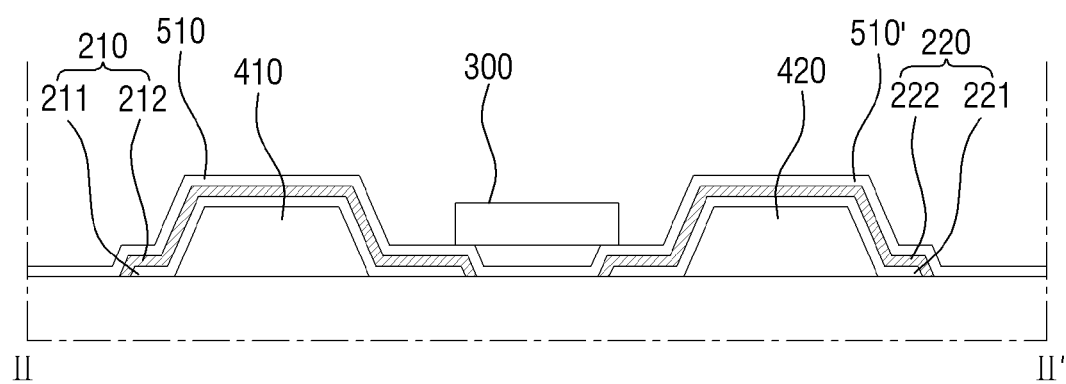

FIGS. 18 and 19 are schematic cross-sectional views respectively illustrating operations in a display device manufacturing method according to an embodiment. For ease of description, members disposed under a via layer 200 are not illustrated in FIG. 18.

Referring to FIG. 18, a substrate including the via layer 200, a first bank 410 and a second bank 420 disposed on the via layer 200 and spaced apart from each other, and a first insulating material layer 510' disposed to cover them may be prepared. The above members may be formed by patterning a metal, an inorganic material or an organic material in a conventional mask process.

Referring to FIG. 19, a light emitting element 300 may land and be aligned on the first electrode 210 and the second electrode 220. The light emitting element 300 may be a kind of dipole, and the alignment of the light emitting element 300 may be performed using the inkjet printing apparatus and the dipole alignment method described above. Thus, a redundant description will be omitted.

Multiple members described above, for example, contact electrodes 260, a third insulating layer 540, and a passivation layer 550 may be formed by performing an additional process, thereby manufacturing a display device 10. In particular, the first insulating material layer 510' may be partially removed to make the contact electrodes 260 contact the first electrode 210 and the second electrode 220. Accordingly, a first insulating layer 510 of FIG. 16 may be formed.

As described above, in the method according to the embodiments, the light emitting element 300 may be aligned with a high degree of alignment between the first electrode 210 and the second electrode 220. The improved alignment may reduce connection or contact failures between the light emitting element 300 and each electrode 210 or 220 or each contact electrode 260 and improve the reliability of each pixel PX of the display device 10.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. An inkjet printing apparatus comprising:
   a stage;
   a print head part disposed above the stage; and
   an electric field generating part that includes antenna parts and that provides an electric field oriented in a horizontal direction parallel to a main surface of the stage in a space between the stage and the print head part.

2. The apparatus of claim 1, wherein the antenna parts include at least two antenna parts each spaced apart from the print head part.

3. The apparatus of claim 1, wherein the antenna parts include at least two antenna parts each spaced apart from the stage.

4. The apparatus of claim 1, wherein the antenna parts include at least two antenna parts each spaced apart from an entire region directly between the print head part and the stage.

5. An inkjet printing apparatus comprising:
   a stage;
   a print head part disposed above the stage, wherein the print head part comprises:
      a print head; and
      a nozzle that sprays ink including a dipole, the nozzle being extended to the print head; and
   an electric field generating part that provides an electric field to a space between the stage and the print head part.

6. The apparatus of claim 5, wherein the dipole comprises a light emitting element.

7. The apparatus of claim 5, wherein the electric field generating part comprises an antenna part which comprises an antenna pattern.

8. The apparatus of claim 7, wherein the antenna part is disposed at a side of the stage.

9. The apparatus of claim 8, wherein the antenna part generates a horizontal electric field in the space between the stage and the print head part.

10. The apparatus of claim 7, wherein the antenna part is disposed between the stage and the print head part.

11. The apparatus of claim 10, wherein the antenna part generates a vertical electric field in the space between the stage and the print head part.

12. The apparatus of claim 10, further comprising a substrate mounting member disposed on the antenna part,
   wherein the antenna part is disposed on the stage and is surrounded between the stage and the substrate mounting member.

13. An inkjet printing apparatus comprising:
   a stage;
   a print head part disposed above the stage;
   an electric field generating part that provides an electric field to a space between the stage and the print head part;
   a probe part; and
   a probe driver driving the probe part.

14. A dipole alignment method comprising:
   providing an electric field at an area above a target substrate;
   spraying ink onto the target substrate through the area, the ink including a dipole; and
   landing the dipole on the target substrate.

15. The method of claim 14, wherein the electric field is provided by an antenna part comprising an antenna pattern.

16. The method of claim 14, wherein the spraying of the ink comprises aligning an orientation direction of the dipole via the electric field.

17. The method of claim 14, wherein
   the target substrate comprises a first electrode and a second electrode, and
   the landing of the dipole comprises landing the dipole on the first electrode and the second electrode.

18. The method of claim 17, wherein the landing of the dipole comprises applying alternating current (AC) power to the first electrode and the second electrode.

19. The method of claim 14, wherein the spraying of the ink onto the target substrate is performed using an inkjet printing apparatus.

20. The method of claim 19, wherein the inkjet printing apparatus comprises:
   a stage;
   a print head part disposed above the stage; and
   an electric field generating part that provides an electric field to a space between the stage and the print head part.

21. A display device manufacturing method comprising:
   preparing a base layer on which a first electrode and a second electrode are disposed;
   providing an electric field at an area above the base layer;
   spraying ink onto the base layer through the area, the ink including a light emitting element; and
   landing the light emitting element between the first electrode and the second electrode.

22. The method of claim 21, wherein
   the base layer comprises pixels,
   the first electrode and the second electrode are disposed in each of the pixels, and
   the light emitting element is landed between the first electrode and the second electrode in each of the pixels.

23. The method of claim 21, wherein the spraying of the ink further comprises aligning an orientation direction of the light emitting element via the electric field.

* * * * *